(12) United States Patent
Matsuura et al.

(10) Patent No.: US 6,835,473 B2
(45) Date of Patent: Dec. 28, 2004

(54) ORGANIC ELECTROLUMINESCENCE ELEMENT AND DISPLAY

(75) Inventors: Mitsunori Matsuura, Tokyo (JP); Taketoshi Yamada, Saitama (JP); Motoi Kinoshita, Tokyo (JP); Hiroshi Kita, Tokyo (JP)

(73) Assignee: Konica Corporation, Tokyo (JP)

( * ) Notice: Subject to any disclaimer, the term of this patent is extended or adjusted under 35 U.S.C. 154(b) by 0 days.

(21) Appl. No.: 10/281,572

(22) Filed: Oct. 28, 2002

(65) Prior Publication Data

US 2003/0157366 A1 Aug. 21, 2003

(30) Foreign Application Priority Data

Dec. 6, 2001 (JP) ........................................ 2001-372601

(51) Int. Cl.$^7$ .............................................. H05B 33/14
(52) U.S. Cl. ........................ 428/690; 428/917; 313/504; 257/102; 257/103
(58) Field of Search ................................ 428/690, 917; 257/40, 102, 103; 252/301.16; 313/506, 504

(56) References Cited

U.S. PATENT DOCUMENTS

| | | | | |
|---|---|---|---|---|
| 5,409,783 A | * | 4/1995 | Tang et al. | 428/690 |
| 6,097,147 A | * | 8/2000 | Baldo et al. | 313/506 |
| 6,262,433 B1 | * | 7/2001 | Arai et al. | 257/40 |
| 6,372,154 B1 | * | 4/2002 | Li | 252/301.16 |
| 6,391,482 B1 | * | 5/2002 | Matsuo et al. | 428/690 |
| 6,534,202 B2 | * | 3/2003 | Sato et al. | 428/690 |
| 6,579,632 B2 | * | 6/2003 | Thompson et al. | 428/690 |

FOREIGN PATENT DOCUMENTS

| | | | |
|---|---|---|---|
| EP | 775706 | * | 5/1997 |
| EP | WO98/36035 | * | 8/1998 |
| EP | 1142895 | * | 10/2001 |
| JP | 2000-290645 | * | 10/2000 |

* cited by examiner

Primary Examiner—Rena L. Dye
Assistant Examiner—Camie Thompson
(74) Attorney, Agent, or Firm—Frishauf, Holtz, Goodman & Chick, P.C.

(57) ABSTRACT

An organic electroluminescence element with a light emission layer containing a host compound and a phosphorescent compound. The host compound contains a boron atom in the molecule and the phosphorescent compound is a metal complex containing a Group VIII metal.

33 Claims, 1 Drawing Sheet

US 6,835,473 B2

ORGANIC ELECTROLUMINESCENCE ELEMENT AND DISPLAY

FIELD OF THE INVENTION

This invention relates to an organic electro-luminescence (hereinafter referred to also as EL) element, and a display, and particularly to an organic electroluminescence element excellent in luminance of emitted light and a display comprising the organic electroluminescence element.

BACKGROUND OF THE INVENTION

As an emission type electronic displaying device, there is an electroluminescence device (ELD). As materials constituting the ELD, there is an inorganic electroluminescence element or an organic electroluminescence element. The inorganic electroluminescence element has been used for a plane-shaped light source, but a high voltage alternating current has been required to drive the element. An organic electroluminescence element has a structure in which a light emission layer containing a light emission compound is arranged between a cathode and an anode, and an electron and a positive hole were injected into the light emission layer and recombined to form an exciton. The element emits light, utilizing light (fluorescent light or phosphorescent light) generated by deactivation of the exciton, and the element can emit light by applying a relatively low voltage of from several to several decade volts. Further, the element has a wide viewing angle and a high visuality since the element is of self light emission type, and the element is a complete solid element, and the element is noted from the viewpoint of space saving and portability.

However, in the organic EL element for practical use, an organic EL element is required which efficiently emits light with high luminance at a lower power.

In U.S. Pat. No. 3,093,796, there is disclosed an element in which stilbene derivatives, distyrylarylene derivatives or tristyrylarylene derivatives are doped with a slight amount of a fluorescent compound.

An element is known which comprises an organic light emission layer containing an 8-hydroxyquinoline aluminum complex as a host compound doped with a slight amount of a fluorescent compound (Japanese Patent O.P.I. Publication No. 63-264692), and an element is known which comprises an organic light emission layer containing an 8-hydroxyquinoline aluminum complex as a host compound doped with a quinacridone type dye (Japanese Patent O.P.I. Publication No. 3-255190). The organic EL element comprising a host compound doped with such a fluorescent compound with high fluorescence quantum yield provides high luminance as compared with conventional organic EL elements.

However, light from the fluorescent compound in a small amount with which the host compound is doped is emitted through excited singlet state. When light emitted through excited singlet state is used, the upper limit of the external quantum efficiency (next) is considered to be at most 5%, as the generation ratio of singlet excited species to triplet excited species is 1:3, that is, the generation probability of excited species capable of emitting light is 25%, and further, external light emission efficiency is 20%. Since an organic EL element, employing phosphorescence through the excited triplet, was reported by Prinston University (M. A. Baldo et al., Nature, 395, 17, p. 151–154 (1998)), study on materials emitting phosphorescence at room temperature has been actively made. (M. A. Baldo et al., Nature, 403, 17, p. 750–753 (2000), and U.S. Pat. No. 6,097,147 etc.)

As the upper limit of the internal quantum efficiency of the excited triplet is 100%, the light emission efficiency of the exited triplet is theoretically four times that of the excited singlet. Accordingly, light emission employing the excited triplet exhibits the same performance as a cold cathode tube, and can be applied to illumination.

It has been found that it is necessary that when a phosphorescent compound is used as a dopant, the maximum emission wavelength of light which a host compound emits, be in the region shorter than the maximum emission wavelength of light which the phosphorescent compound emits, and in addition, there exist other requisitions to be satisfied.

Several proposals with respect to the phosphorescent material were made in "The $10^{th}$ International Workshop On Inorganic and Organic Electroluminescence (EL '00, Hamamatsu)". For example, Ikai et al. use, a hole transporting compound as a dopant of a phosphorescent material, M. E. Tompson et al. use, as a host compound of a phosphorescent material, various kinds of electron transporting compounds, which are doped with a new iridium complex, and Tsutsui et al. obtain high light emission efficiency due to introduction of a hole blocking layer.

The host compounds of phosphorescent compounds are disclosed in for example, C. Adachi et al., "Appl. Phys. Lett., 77, pp. 904 (2000)", but an approach from a new aspect with respect to characteristics required in the host compounds is necessary to obtain an organic electroluminescence element emitting light with high luminance. However, any technique described above does not provide an organic EL element providing both high emission luminance and long emission lifetime.

SUMMARY OF THE INVENTION

The present invention has been made in order to obtain an organic electroluminescence element providing high emission luminance and long emission lifetime. Accordingly, an object of the present invention is to provide an organic electro-luminescence element emitting light with high emission luminance and long emission lifetime, and a display emitting light with high emission luminance and long emission lifetime, which employs the organic electroluminescence element.

DETAILED DESCRIPTION OF THE INVENTION

Figure 1:
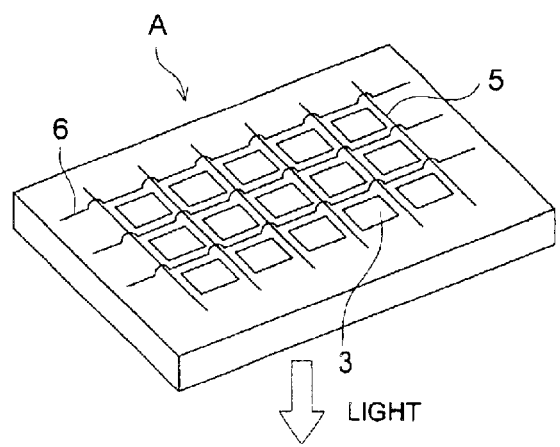
FIG. 1 is a schematic drawing of a displaying section of a full color display employing an active matrix system.

The object of the invention has been attained by the following constitutions:

1. An organic electroluminescence element comprising a light emission layer containing a host compound and a phosphorescent compound, wherein the host compound contains a boron atom in the molecule.
2. The organic electroluminescence element of item 1 above, wherein the host compound further contains a nitrogen atom in the molecule.
3. The organic electroluminescence element of item 1 above, wherein the host compound is a compound represented by the following formula (1):

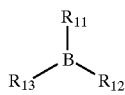

formula (1)

wherein B represents a boron atom; and $R_{11}$, $R_{12}$ and $R_{13}$ independently represent a monovalent substituent, provided that at least one of $R_{11}$, $R_{12}$ and $R_{13}$ represents an aromatic group, and when any one of $R_{11}$, $R_{12}$ and $R_{13}$ represents an aromatic group, the other two may combine with each other to form a ring together with the boron atom.

4. The organic electroluminescence element of item 3 above, wherein the monovalent substituent represented by $R_{11}$, $R_{12}$ and $R_{13}$ is an alkyl group, a cycloalkyl group, an aryl group, an alkoxy group, an aryloxy group, an alkylthio group, an arylthio group, a halogen atom, a cyano group, a nitro group, or a heterocyclic group.

5. The organic electroluminescence element of item 3 above, wherein in formula (1), all of $R_{11}$, $R_{12}$ and $R_{13}$ are aromatic groups.

6. The organic electroluminescence element of item 3 above, wherein the host compound has a molecular weight of from 410 to 2000.

7. The organic electroluminescence element of item 3 above, wherein the host compound has a molecular weight of from 600 to 2000.

8. The organic electroluminescence element of item 1 above, wherein the host compound is a compound represented by the following formula (2):

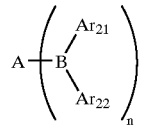

formula (2)

wherein B represents a boron atom; $Ar_{21}$ and $Ar_{22}$ independently represent an aromatic group; A represents a divalent to pentadecavalent group; and n is an integer of from 2 to 15.

9. The organic electroluminescence element of item 8 above, wherein the divalent to pentadecavalent group represented by A is a residue of a monocyclic compound, a residue of a condensed ring compound, or a residue of a compound having two or more rings in the molecule, separately.

10. The organic electroluminescence element of item 1 above, wherein the host compound is a compound represented by the following formula (3):

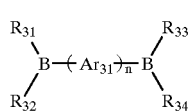

formula (3)

wherein B represents a boron atom; $Ar_{31}$ represents a monocyclic aromatic group; $R_{31}$, $R_{32}$, $R_{33}$ and $R_{34}$ independently represent a monovalent substituent; and n represents an integer of from 1 to 5.

11. The organic electroluminescence element of item 10 above, wherein the monovalent substituent represented by $R_{31}$, $R_{32}$, $R_{33}$ and $R_{34}$ is an alkyl group, a cycloalkyl group, an aryl group, an alkoxy group, an aryloxy group, an alkylthio group, an arylthio group, a halogen atom, a cyano group, a nitro group, or a heterocyclic group.

12. The organic electroluminescence element of item 10 above, wherein the host compound is a compound represented by the following formula (4):

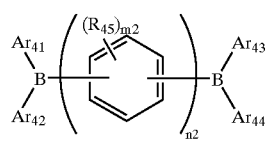

formula (4)

wherein B represents a boron atom; $Ar_{41}$, $Ar_{42}$, $Ar_{43}$ and $Ar_{44}$ independently represent an aromatic group; $R_{45}$ represents a hydrogen atom or a monovalent substituent; n2 is an integer of 1 to 5; and m2 is an integer of 1 to 4, provided that plural $R_{45}$s may be the same or different.

13. The organic electroluminescence element of item 7 above, wherein the host compound is a compound represented by the following formula (5):

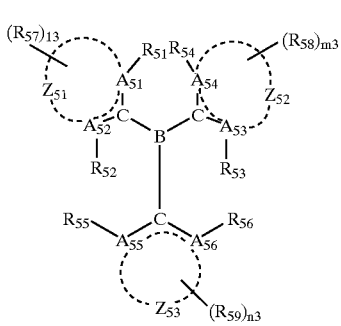

formula (5)

wherein B represents a boron atom; C represents a carbon atom; $A_{51}$, $A_{52}$, $A_{53}$, $A_{54}$, $A_{55}$, and $A_{56}$ independently represent a carbon atom, a nitrogen atom or a sulfur atom; $Z_{51}$ represents an atomic group necessary to form an aromatic ring together with C, $A_{51}$, and $A_{52}$; $Z_{52}$ represents an atomic group necessary to form an aromatic ring together with C, $A_{53}$ and $A_{54}$; $Z_{53}$ represents an atomic group necessary to form an aromatic ring together with C, $A_{55}$ and $A_{56}$; $R_{51}$, $R_{52}$, $R_{53}$, $R_{54}$, $R_{55}$, and $R_{56}$ independently represent a hydrogen atom or a monovalent substituent, provided that at least four of $R_{51}$, $R_{52}$, $R_{53}$, $R_{54}$, $R_{55}$, and $R_{56}$ represent the monovalent substituent; $R_{57}$, $R_{58}$s and $R_{59}$ independently represent a hydrogen atom or a monovalent substituent; and 13, n3 and m3 independently represent an integer of from 1 to 7, provided that plural $R_{57}$s, $R_{58}$s and $R_{59}$s may be the same or different, respectively.

14. The organic electroluminescence element of item 13 above, wherein all of $R_{51}$, $R_{52}$, $R_{53}$, $R_{54}$, $R_{55}$, and $R_{56}$ in formula (5) are the monovalent substituents.

15. The organic electroluminescence element of item 13 above, wherein the monovalent substituent represented by $R_{51}$, $R_{52}$, $R_{53}$, $R_{54}$, $R_{55}$, $R_{56}$, $R_{57}$; $R_{58}$, and $R_{59}$ in formula (5) is an alkyl group, a cycloalkyl group, an aryl group, an alkoxy group, an aryloxy group, an alkylthio group, an arylthio group, a halogen atom, a cyano group, a nitro group, or a heterocyclic group.

16. The organic electroluminescence element of item 15 above, wherein the monovalent substituent is an alkyl group, a cycloalkyl group, an alkoxy group, an aryloxy group, or a halogen atom.

17. The organic electroluminescence element of item 13 above, wherein the host compound has a molecular weight of from 410 to 2000.

18. The organic electroluminescence element of item 13 above, wherein the host compound has a molecular weight of from 600 to 2000.

19. The organic electroluminescence element of item 2 above, wherein the host compound is a compound represented by the following formula (6):

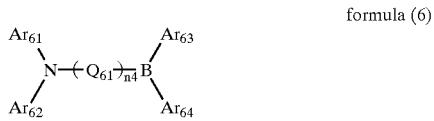

formula (6)

wherein N represents a nitrogen atom; B represents a boron atom; $Ar_{61}$, $Ar_{62}$, $Ar_{63}$ and $Ar_{64}$ independently represent a substituted or unsubstituted aromatic group; $Q_{61}$ represents an aromatic group; and n4 is an integer of from 1 to 5.

20. The organic electroluminescence element of item 1 above, wherein the host compound has a molecular weight of from 410 to 2000.

21. The organic electroluminescence element of item 20 above, wherein the host compound has a molecular weight of from 600 to 2000.

22. The organic electroluminescence element of item 21 above, wherein the host compound has a molecular weight of from 800 to 2000.

23. The organic electroluminescence element of item 1 above, wherein the phosphorescent compound is an osmium complex, an iridium complex or a platinum complex.

24. The organic electroluminescence element of item 23 above, wherein the phosphorescent compound is an iridium complex.

25. A display comprising an organic electroluminescence element, wherein the organic electroluminescence element comprises a light emission layer containing a phosphorescent compound and a host compound containing a boron atom in the molecule.

101. An organic electroluminescence element comprising a light emission layer containing a host compound and a phosphorescent compound, wherein the host compound contains a boron atom in the molecule.

102. The organic electroluminescence element of item 101 above, wherein the host compound further contains a nitrogen atom in the molecule.

103. The organic electroluminescence element of item 101 above, wherein the host compound is a compound represented by formula (1) described above.

104. The organic electroluminescence element of item 103 above, wherein in formula (1), all of $R_{11}$, $R_{12}$ and $R_{13}$ are aromatic groups.

105. The organic electroluminescence element of item 101 above, wherein the host compound is a compound represented by formula (2) described above.

106. The organic electroluminescence element of item 101 above, wherein the host compound is a compound represented by formula (3) described above.

107. The organic electroluminescence element of item 106 above, wherein the host compound is a compound represented by formula (4) described above.

108. The organic electroluminescence element of item 104 above, wherein the host compound is a compound represented by formula (5) described above.

109. The organic electroluminescence element of item 108 above, wherein all of $R_{51}$, $R_{52}$, $R_{53}$, $R_{54}$, $R_{55}$, and $R_{56}$ in formula (5) are the monovalent substituents.

110. The organic electroluminescence element of item 108 or 109 above, wherein $R_{51}$, $R_{52}$, $R_{53}$, $R_{54}$, $R_{55}$, and $R_{56}$ in formula (5) independently represent an alkyl group, an alkoxy group, an aryloxy group, or a halogen atom.

111. The organic electroluminescence element of item 102 above, wherein the host compound is a compound represented by formula (6) described above.

112. The organic electroluminescence element of any one of items 101 through 111 above, wherein the host compound has a molecular weight of from 410 to 2000.

113. The organic electroluminescence element of any one of items 101 through 111 above, wherein the host compound has a molecular weight of from 600 to 2000.

114. The organic electroluminescence element of any one of items 101 through 111 above, wherein the host compound has a molecular weight of from 800 to 2000.

115. The organic electroluminescence element of any one of items 101 through 114 above, wherein the phosphorescent compound is an osmium complex, an iridium complex or a platinum complex.

116. The organic electroluminescence element of item 115 above, wherein the phosphorescent compound is an iridium complex.

117. A display comprising the organic electroluminescence element of any one of items 101 through 116 above.

The present invention will be explained in detail below.

The present inventors have made an extensive study on a host compound used in an organic electroluminescence element comprising a phosphorescent compound as a dopant compound and employing phosphorescence emission from the excited triplet, and as a result, they have found that an organic electroluminescence element comprising, as a host compound, a compound containing a boron atom in the molecule provides high emission luminance and long emission lifetime.

The organic electroluminescence element of the invention comprises a light emission layer containing a phosphorescent compound and a host compound containing a boron atom in the molecule. With respect to the host compound and the dopant compound contained in the light emission layer, when the light emission layer is comprised of a mixture of two or more kinds of compounds, the compound having the highest content (by weight) in the mixture is the host compound and the compound having a lower content (by weight) in the mixture is the dopant compound. For example, when the compound A to compound B ratio (by weight) in the light emission layer is 10:90, compound A is a dopant compound, and the compound B is a host compound. Further, when the content ratio, compound A:compound B:compound C in the light emission layer is 5:10:85, compounds A and B are dopant compounds, and compound C is a host compound. The fluorescent compound in the invention is one kind of the dopant compounds.

The phosphorescent compound in the invention is a compound emitting light through the exited triplet state, and has a phosphorescent quantum yield at 25° C. of not less than 0.001, preferably not less than 0.01, and more preferably not less than 0.1.

The phosphorescent quantum yield described above can be measured according to a method described in the fourth edition, Jikken Kagaku Koza 7, Bunko II, p. 398 (1992) (published by Maruzen). The phosphorescent quantum yield in the solution can be measured employing various kinds of solvents. The phosphorescent compound used in the invention is a compound providing a phosphorescent quantum yield as described above even if the yield is measured in any solvent.

The phosphorescent compound is preferably a metal complex containing a metal belonging to a group VIII of the periodic table as a center metal, and is more preferably an iridium complex, an osmium complex, or a platinum complex.

Examples of the phosphorescent compounds, iridium complexes, osmium complexes and platinum complexes are listed below, but the present invention is not limited thereto. These compounds can be synthesized according to a method disclosed in for example, Inorg. Chem., Vol. 40, 1704–1711.

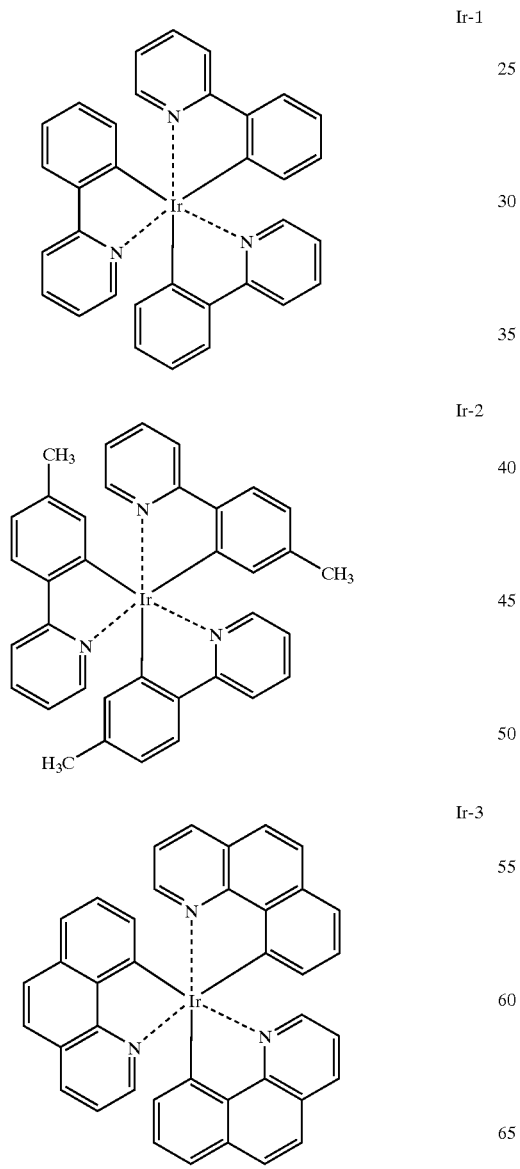

Ir-9
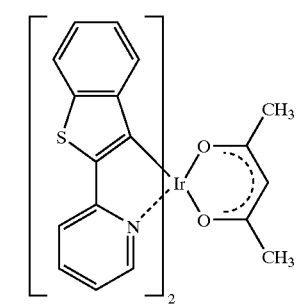

Ir-10
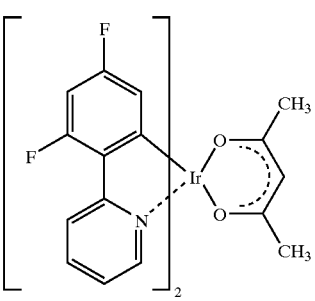

Ir-11
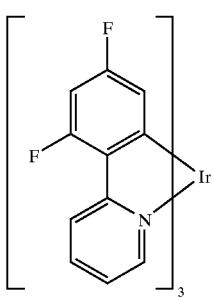

Ir-12
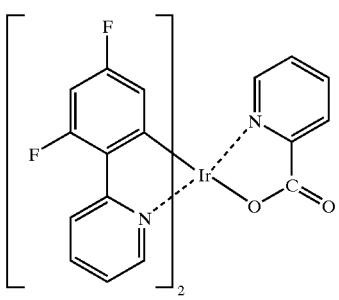

Pt-1
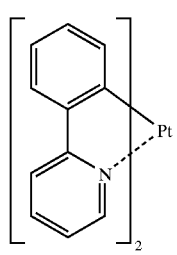

Pt-2
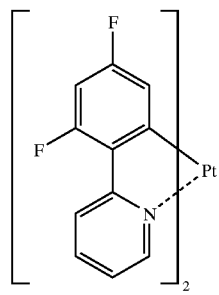

Pt-3
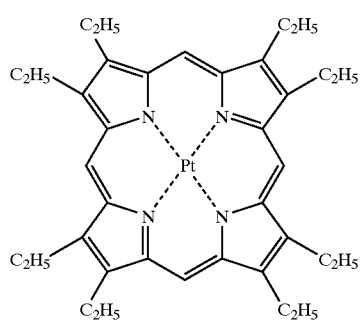

A-1
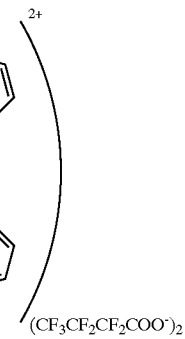

As another embodiment of the invention, there is an organic electroluminescence element comprising, in addition to a host compound and a phosphorescent compound, another fluorescent compound having a maximum fluorescence wavelength longer than the maximum emission wavelength of light emitted by the phosphorescent compound. In this case, electro-luminescence of the EL element is emitted from the fluorescent compound to which energy is transferred from the host compound and the phosphorescent compound. A preferred fluorescent compound has a high quantum yield in the form of solution. Herein, the quantum yield is preferably not less than 10%, and more preferably not less than 30%. Examples of the fluorescent compound include a qumarine dye, a cyanine dye, a chloconium dye, a squalenium dye, an oxobenzanthracene dye, a fluorescene dye, a rhodamine dye, a pyrylium dye, a perylene dye, a stilbene dye, a polythiophene dye, and a fluorescent compound of a rare earth element complex type.

The fluorescent quantum yield herein can be measured according to a method described in the fourth edition, Jikken Kagaku Koza 7, Bunko II, p. 362 (1992) (published by Maruzen). In the invention, tetrahydrofuran is employed as a solvent for measurement.

The host compound used in the invention will be explained below.

The host compound used in the invention (hereinafter referred to also as the host compound in the invention) is a compound containing a boron atom in its molecule, and preferably a compound represented by formula (1). In formula (1), B represents a boron atom; and $R_{11}$, $R_{12}$ and $R_{13}$ independently represent a monovalent substituent, provided that at least one of $R_{11}$, $R_{12}$ and $R_{13}$ represents an aromatic group, and when any one of $R_{11}$, $R_{12}$ and $R_{13}$ represents an aromatic group, the other two may combine with each other to form a ring together with the boron atom. Examples of the monovalent substituent represented by $R_{11}$, $R_{12}$ and $R_{13}$ include an alkyl group or a cyclic alkyl group (for example, a methyl group, an ethyl group, an i-propyl group, a hydroxyethyl group, a methoxymethyl group, a trifluoromethyl group, a t-butyl group, a cyclopentyl group, a cyclohexyl group, or a benzyl group); an aryl group (for example, a phenyl group, a naphthyl group, a p-tolyl group or a p-chlorophenyl group); an alkoxy group (for example, a methoxy group, an ethoxy group, an i-propoxy group or a butoxy group); an aryloxy group (for example, a phenoxy group); an alkylthio group (for example, a methylthio group, an ethylthio group, or an i-propylthio group); an arylthio group (for example, a phenylthio group); a halogen atom (for example, a fluorine atom, a chlorine atom, a bromine atom or an iodine atom); a cyano group; a nitro group; and a heterocyclic group (for example, a pyrrolyl group, a pyrrolidyl group, a pyrazolyl group, an imidazolyl group, a pyridyl group, a benzimidazolyl group, a benzothiazolyl group, or a benzoxazolyl group). Examples of the aromatic group include the above aryl group and the above aromatic heterocyclic group such as a pyrrolyl group, a pyrazolyl group, an imidazolyl group, a pyridyl group, a benzimidazolyl group, a benzothiazolyl group, or a benzoxazolyl group. The aromatic group described above may have a substituent. It is preferred that all of $R_{11}$, $R_{12}$ and $R_{13}$ are aromatic groups.

Next, formula (2) will be explained.

In formula (2), B represents a boron atom; $Ar_{21}$ and $Ar_{22}$ independently represent an aromatic group; A represents a divalent to pentadecavalent group; and n is an integer of from 2 to 15. Examples of the aromatic group represented by $Ar_{21}$ and $Ar_{22}$ include the same as those denoted in the aromatic group of formula (1). The divalent to pentadecavalent group represented by A is a residue of a monocyclic compound, a residue of a condensed ring compound or a residue of a compound having two or more rings (single or condensed) in the molecule, separately. The above two or more rings may combine with each other through a carbon atom, an oxygen atom, a nitrogen atom, a sulfur atom or a group comprising them. The above two or more rings are preferably aromatic rings. Further, n is preferably from 2 to 6.

Examples of A include a residue of a substituted or unsubstituted monocyclic compound or substituted or unsubstituted condensed ring compound, for example, benzene, toluene, naphthalene, anthracene, phenanthrene, fluorene, pyrene, perylene, azulene, fluorenone, furan, thiophene, pyrrole, pyridine, oxazole, pyrazine, pyrimidine, oxadiazole, triazole, indole, quinoline, isoquinoline, carbazole, acridine, benzothiazole, phenanthroline, or quinacridone; a residue of a compound in which plural rings (preferably aromatic rings) directly combine with each other, for example, biphenyl, terphenyl, binaphthyl, triphenyl benzene, diphenylanthracene, rubrene, bipyridine, biquinoline or bithiophene; and a residue of a compound in which plural rings (preferably aromatic rings) combine with each other through a non-aromatic group, for example, stilbene, diphenylmethane, diphenyl ether, benzophenone, diphenyl sulfide, or triphenylamine.

Next, formula (3) will be explained.

In formula (3), B represents a boron atom; $Ar_{31}$ represents a monocyclic aromatic group; $R_{31}$, $R_{32}$, $R_{33}$ and $R_{34}$ independently represent a monovalent substituent; and n represents an integer of from 1 to 5. Examples of the monocyclic aromatic group represented by $Ar_{31}$ include a group derived from benzene, furan, thiophene, pyrrole, oxazole, imidazole, thiazole, triazole, pyridine, pyridazine, pyrimidine, pyrazine, or triazine. The monocyclic aromatic group may have a substituent. Examples of the monovalent substituent represented by $R_{31}$, $R_{32}$, $R_{33}$ and $R_{34}$ include the same as those denoted in the monovalent substituent of formula (1).

The compound represented by formula (3) is preferably a compound represented by formula (4). In formula (4), B represents a boron atom; $Ar_{41}$, $Ar_{42}$, $Ar_{43}$ and $Ar_{44}$ independently represent an aromatic group; $R_{45}$ independently represent a hydrogen atom or a monovalent substituent; n2 is an integer of 1 to 5; and m2 is an integer of 1 to 4, provided that plural $R_{45}$s may be the same or different. Examples of the aromatic group represented by $Ar_{41}$, $Ar_{42}$, $Ar_{43}$ and $Ar_{44}$ in formula (4) include the same as those denoted in $Ar_{21}$ of formula (2), and examples of the monovalent substituent represented by $R_{45}$ include the same as those denoted in the monovalent substituent of formula (1).

Next, formula (5) will be explained.

In formula (5), B represents a boron atom; C represents a carbon atom; $A_{51}$, $A_{52}$, $A_{53}$, $A_{54}$, $A_{55}$, and $A_{56}$ independently represent a carbon atom, a nitrogen atom or a sulfur atom; $Z_{51}$ represents an atomic group necessary to form an aromatic ring together with C, $A_{51}$, and $A_{52}$; $Z_{52}$ represents an atomic group necessary to form an aromatic ring together with C, $A_{53}$, and $A_{54}$; $Z_{53}$ represents an atomic group necessary to form an aromatic ring together with C, $A_{55}$, and $A_{56}$; $R_{51}$, $R_{52}$, $R_{53}$, $R_{54}$, $R_{55}$, and $R_{56}$ independently represent a hydrogen atom or a monovalent substituent, provided that at least four of $R_{51}$ $R_{52}$, $R_{53}$, $R_{54}$, $R_{55}$, and $R_{56}$ represent the monovalent substituent; $R_{57}$, $R_{58}$ and $R_{59}$ independently represent a hydrogen atom or a monovalent substituent; and l3, n3 and m3 independently represent an integer of from 1 to 7, provided that plural $R_{57}$s, $R_{58}$s and $R_{59}$s may be the same or different, respectively. Examples of the aromatic ring formed by $Z_{51}$, C, $A_{51}$, and $A_{52}$, the aromatic ring formed by $Z_{52}$, C, $A_{53}$ and $A_{54}$, or the aromatic ring formed by $Z_{53}$, C, $A_{55}$ and $A_{56}$ include the same as the aromatic rings (single or condensed) denoted in A of formula (2). Examples of the monovalent substituent represented by $R_{51}$, $R_{52}$, $R_{53}$, $R_{54}$, $R_{55}$, $R_{56}$, $R_{57}$, $R_{58}$ and $R_{59}$ include the same as those denoted in the monovalent substituent of formula (1).

It is preferable that all of $R_{51}$ through $R_{56}$ are the monovalent substituents, and it is more preferable that $R_{51}$ through $R_{56}$ independently represent an alkyl group, a cycloalkyl group, an alkoxy group, an aryloxy group or a halogen atom.

Next, formula (6) will be explained.

In formula (6), N represents a nitrogen atom; B represents a boron atom; $Ar_{61}$, $Ar_{62}$, $Ar_{63}$ and $Ar_{64}$ independently represent a substituted or unsubstituted aromatic group; $Q_{61}$ represents an aromatic group; and n4 is an integer of from 1 to 5. Examples of the aromatic group represented by $Ar_{61}$, $Ar_{62}$, $Ar_{63}$ and $Ar_{64}$ include the same as those denoted in $Ar_{21}$ of formula (2), and examples of the aromatic group represented by $Q_{61}$ include the same as those denoted in the $Ar_{31}$ of formula (3).

The molecular weight of the host compound in the invention used in the organic electroluminescence element of the invention is in the range of preferably from 410 to 2000, more preferably from 600 to 2000, and most preferably from 800 to 2000. The host compound in the invention with a molecular weight of from 410 to 2000 increases thermal stability of the organic electroluminescence element due to its high Tg (glass transition point), and lengthens life of the organic electroluminescence element.

Examples of the host compound in the invention are listed below, but the invention is not limited thereto.

1-1
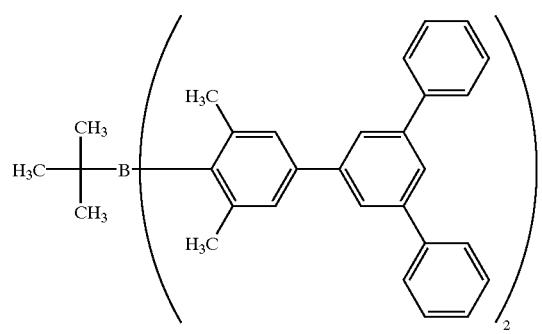
1-2
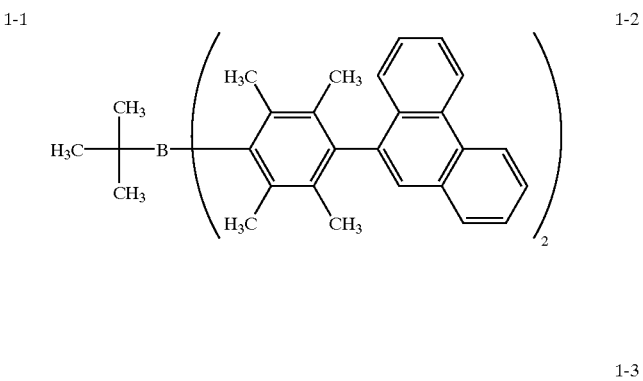
1-3
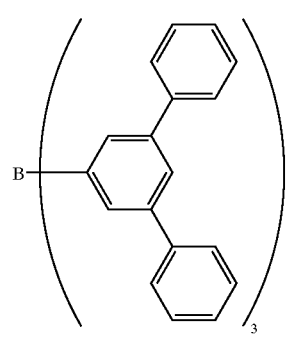
1-4
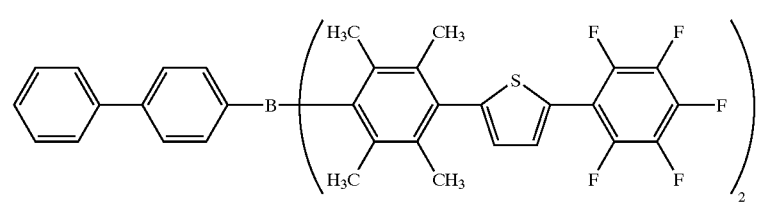
1-5
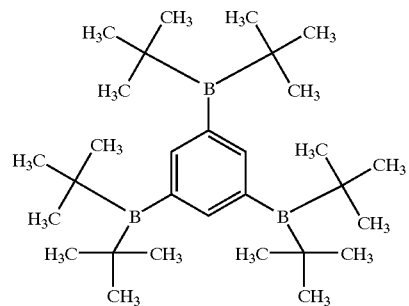
1-6
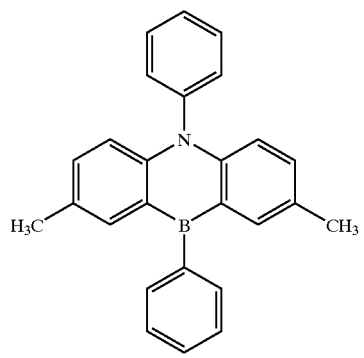
1-7
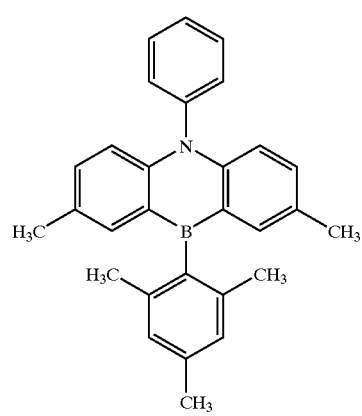
1-8
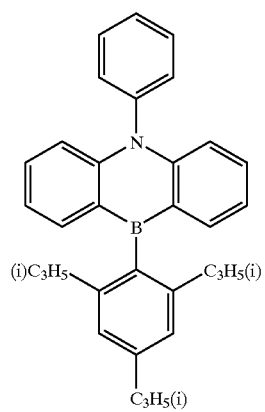

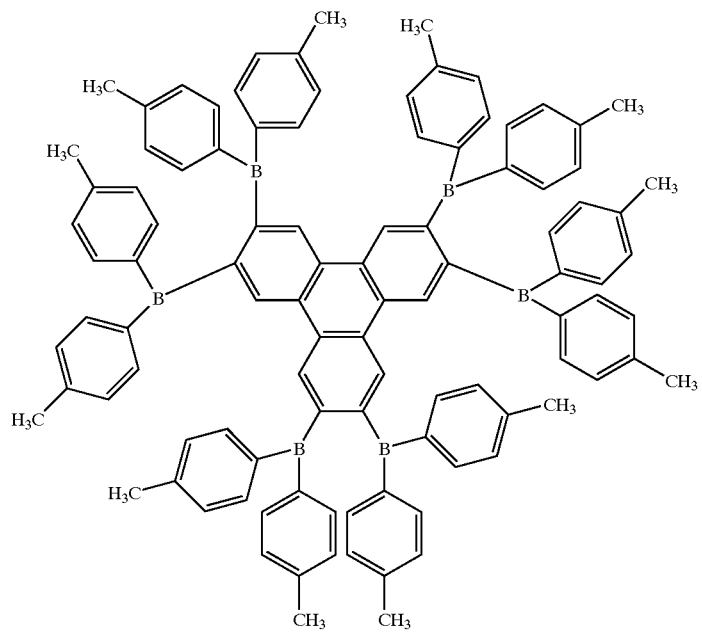
2-1
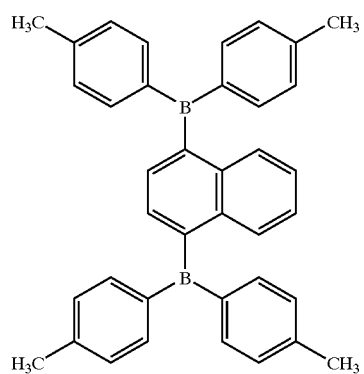
2-2
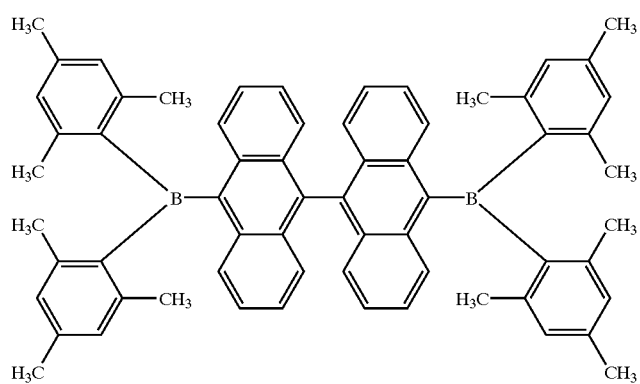
2-3

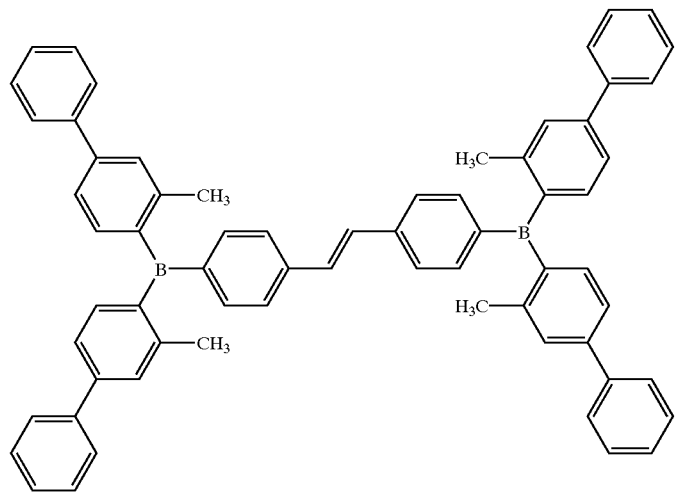
2-4
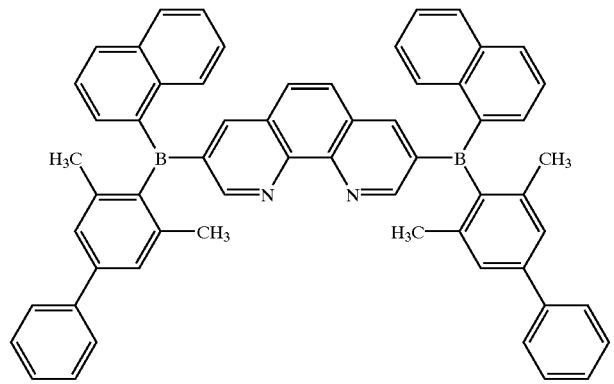
2-5
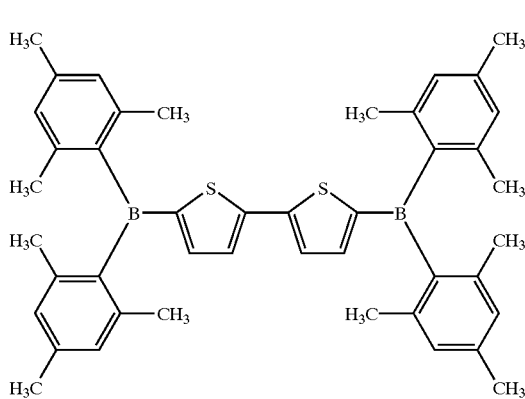
3-1
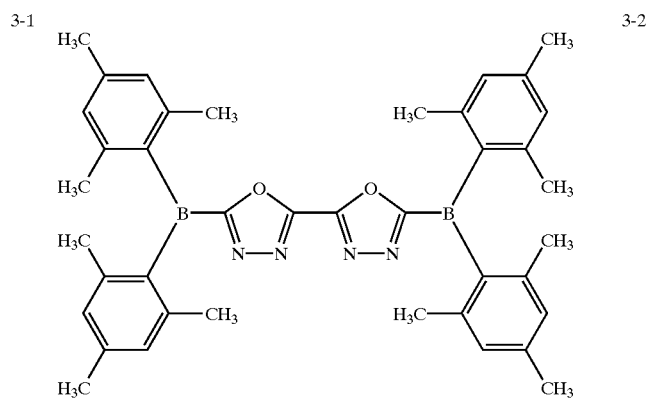
3-2

-continued
3-3
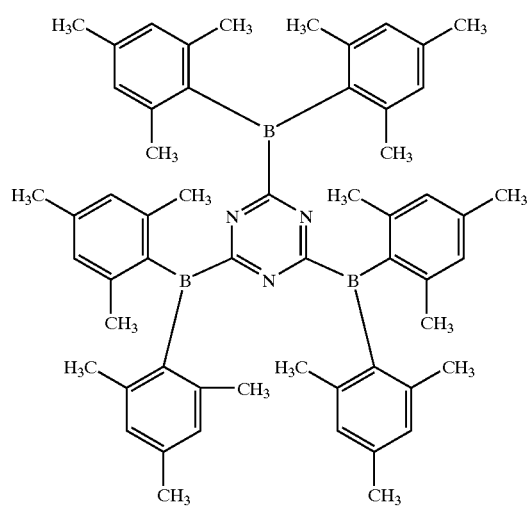
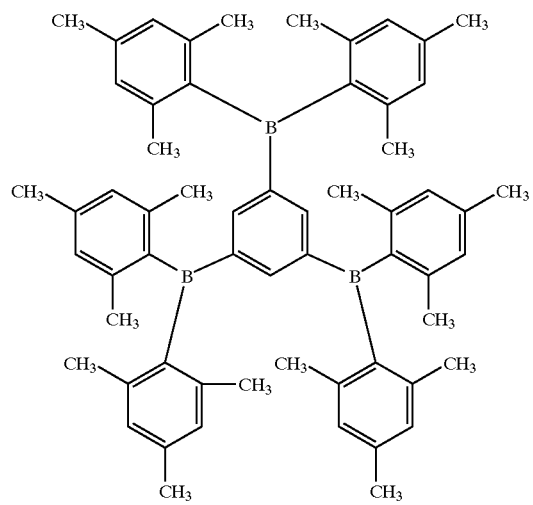
4-1
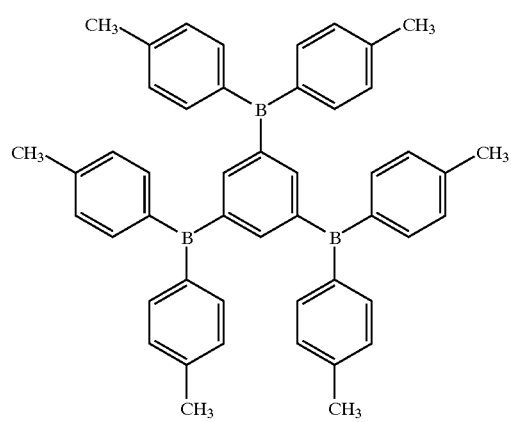
4-2
4-3
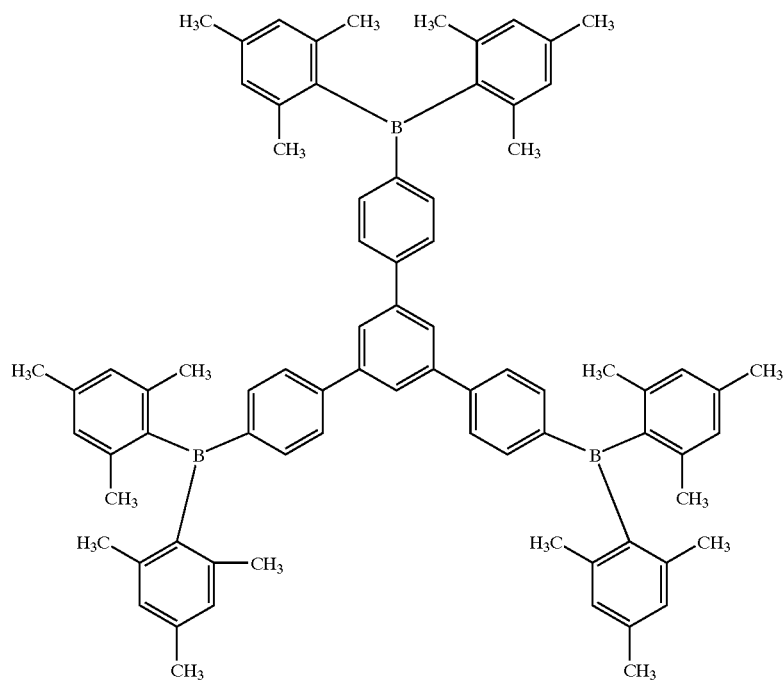

-continued
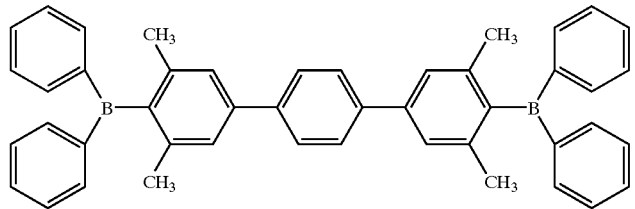
4-4
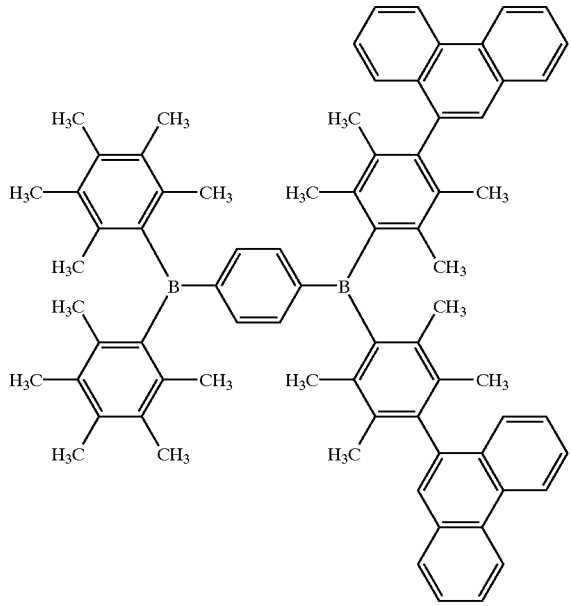
4-5
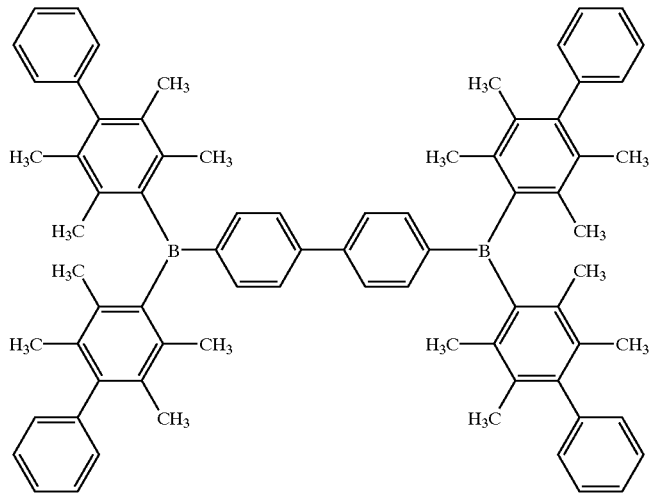
4-6
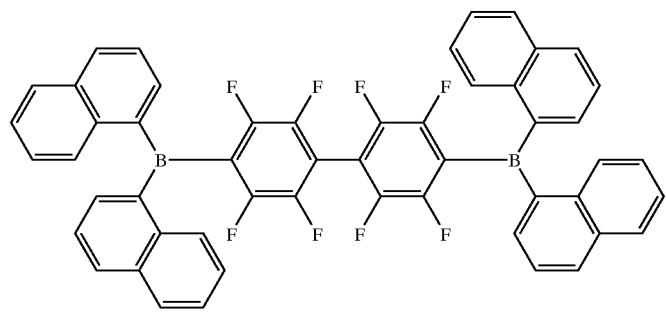
4-7

-continued
4-8
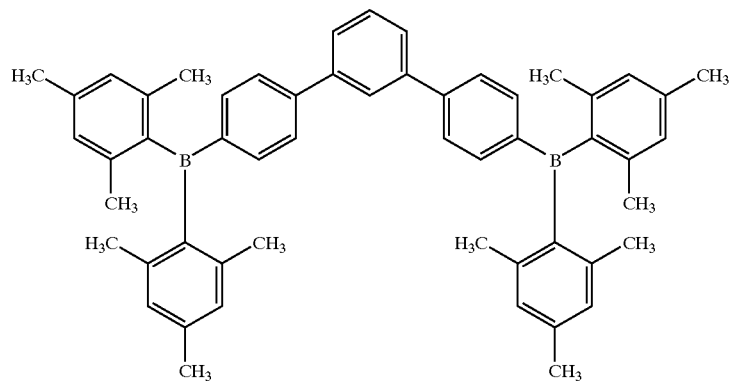
5-1
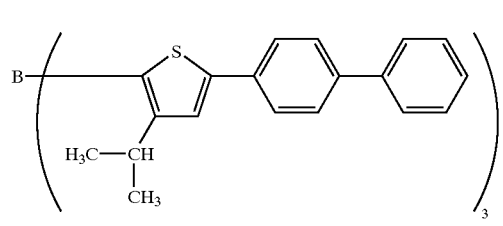
5-2
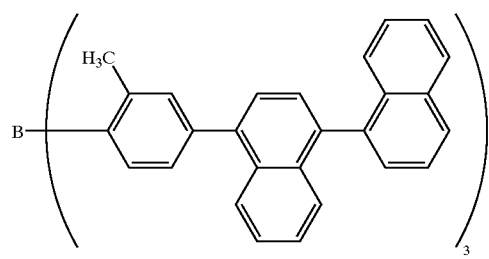
5-3
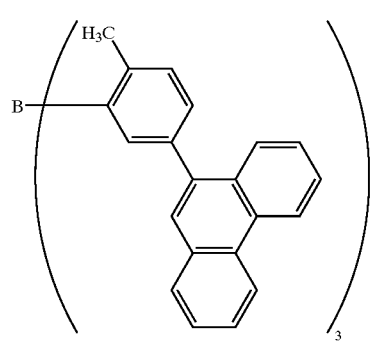
5-4
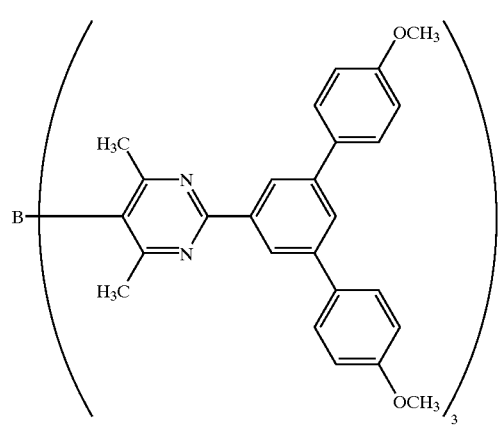
5-5
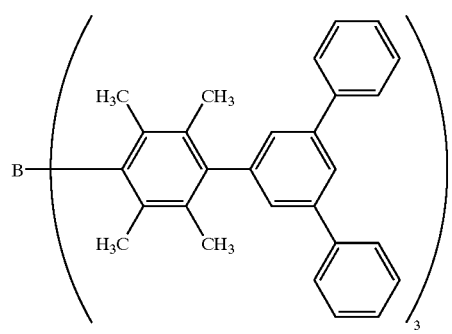
5-6
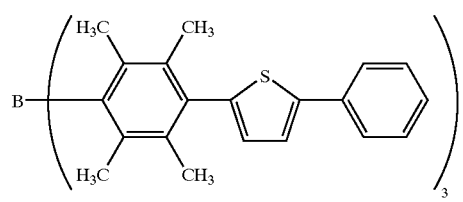

-continued
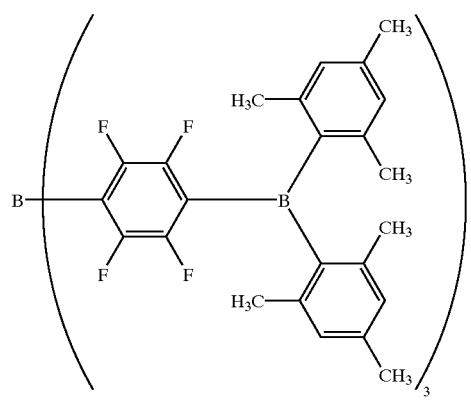
5-7
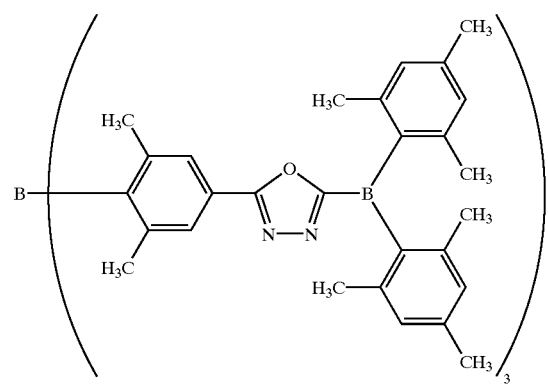
5-8
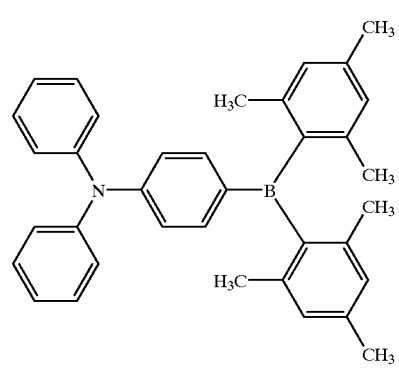
6-1
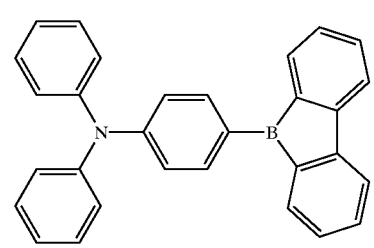
6-2
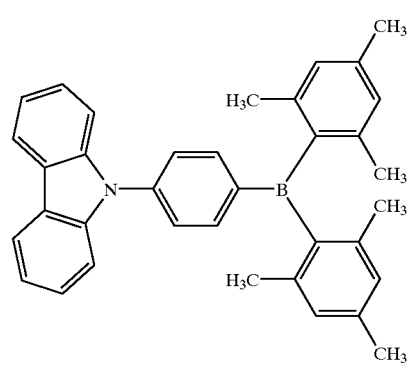
6-3
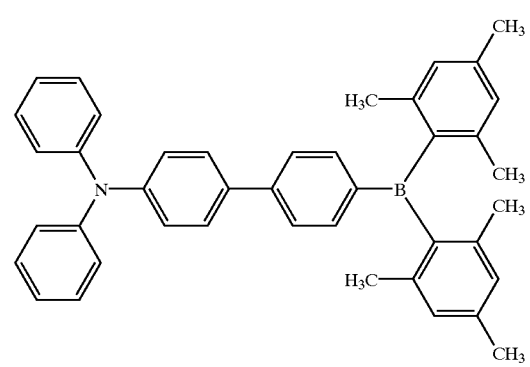
6-4
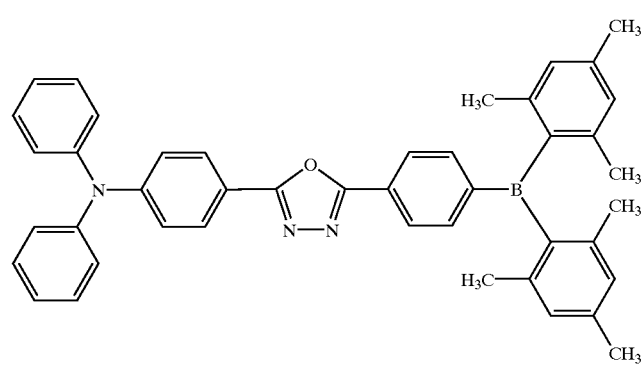
6-5

6-6
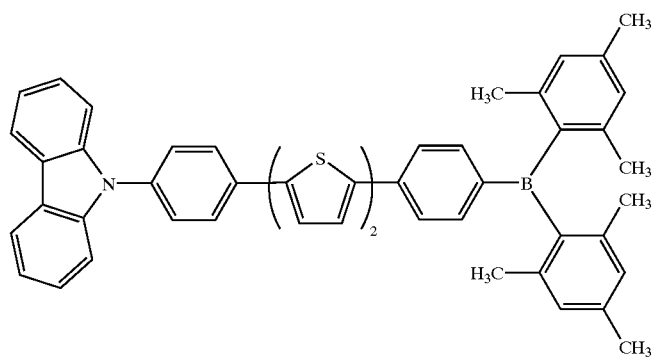
6-7
6-8
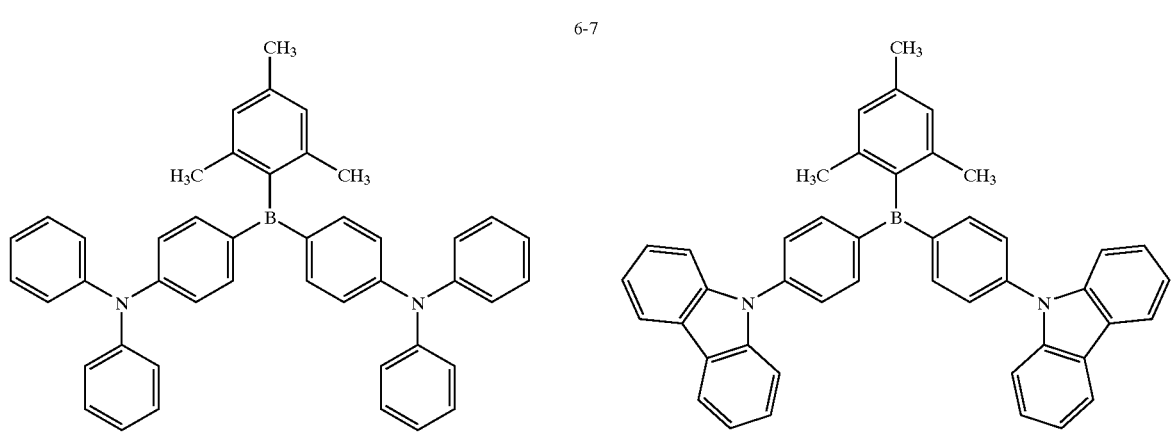
6-9
6-10
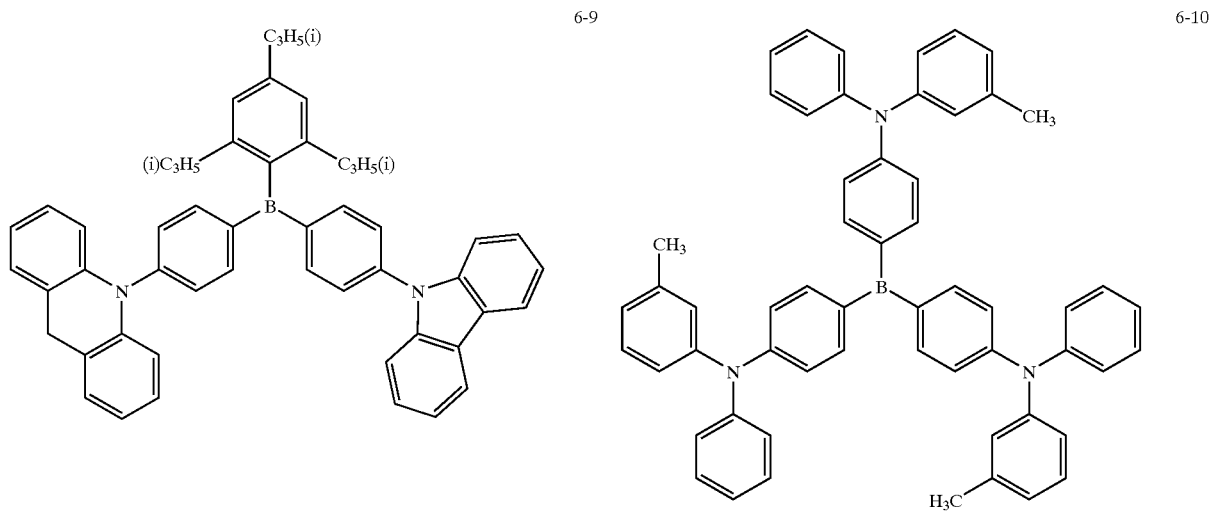

-continued
6-11
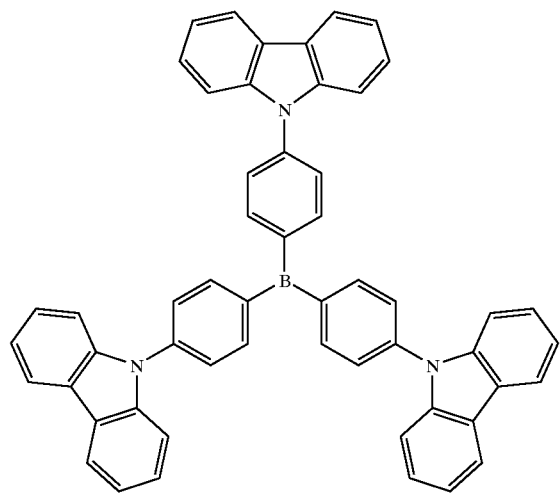
6-12
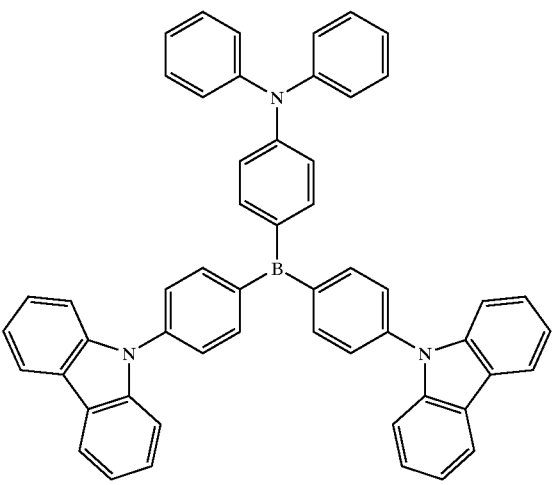
6-13
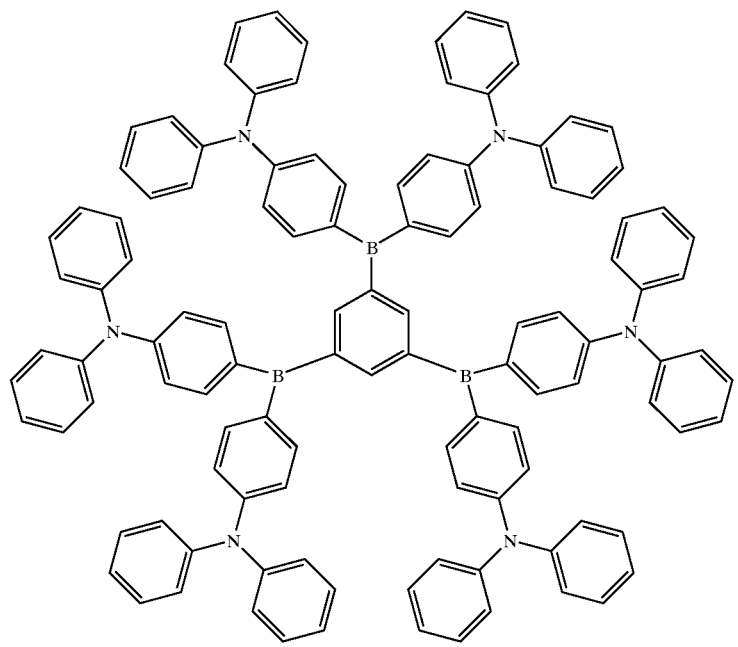
6-14
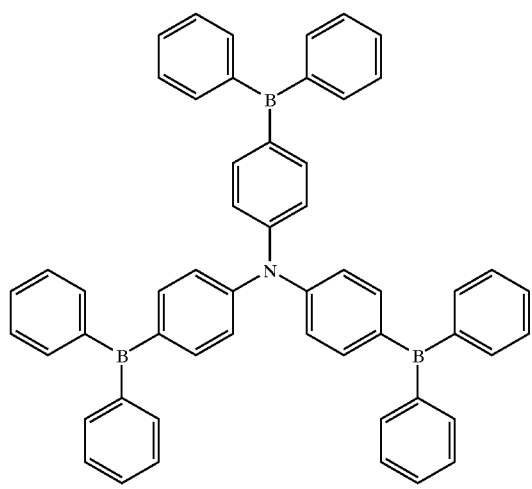

These compounds can be prepared according to a known methods, for example, a method as described in Japanese Patent O.P.I. Publication No. 2001-93670.

An electroluminescence element (EL element) will be detailed below.

The light emission layer of the electroluminescence element broadly refers to a layer emitting light when electric current is supplied to the electrode comprised of the cathode and the anode. Typically, the light emission layer is a layer containing a fluorescent compound emitting light when electric current is supplied to an electrode comprised of a cathode and an anode. The organic electroluminescence element (EL element) basically has a structure in which a light emission layer is provided between a pair of electrodes. The organic EL element of the invention has a structure in which in addition to the light emission layer, a hole transporting layer, an electron transporting layer, an anode buffering layer or a cathode buffering layer is optionally provided between the cathode and the anode.

In concrete, the following structures are included.
(i) Anode/Light emission layer/Cathode
(ii) Anode/Hole transporting layer/Light emission layer/Cathode
(iii) Anode/Light emission layer/Electron transporting layer/Cathode
(iv) Anode/Hole transporting layer/Light emission layer/Electron transporting layer/Cathode
(v) Anode/Anode buffering layer/Hole transporting layer/Light emission layer/Electron transporting layer/Cathode buffering layer/Cathode As methods of forming a light emission layer employing the compounds mentioned above, there are known methods for forming a thin layer such as a deposition method, a spin-coat method, a casting method and an LB method. The light emission layer is preferably a molecular deposit layer. The molecular deposit layer herein refers to a layer formed by deposition of the above compounds in a gaseous state, or by solidification of the above compounds in a melted state or a liquefied state. The molecular deposit layer is distinguished from a thin layer (molecular cumulation layer) formed by an LB method in structure, for example, an aggregated structure or a higher order structure, or in function. The function difference results from the structural difference between them.

Further, the light emission layer can be formed by the method such as that described in Japanese Patent O.P.I. Publication No. 57-51781, in which the above compound as a light emission material is dissolved in a solvent together with a binder such as a resin, and the thus obtained solution is coated on a substrate to form a thin layer by a method such as a spin-coat method. The thickness of the thus formed light emission layer is not specially limited, and is optionally selected, but the thickness is ordinarily within the range of from 5 nm to 5 $\mu$m.

As described above, the phosphorescent compound in the invention is concretely a heavy metal complex, preferably a metal complex containing, as a center metal, a metal belonging to a group VIII of the periodic table, and more preferably a metal complex compound containing osmium, iridium or platinum.

The phosphorescent compound has a phosphorescent quantum yield in the solution at 25° C. of preferably not less than 0.001 at 25° C., as described above, and has a maximum phosphorescence wavelength longer than a maximum fluorescence wavelength of a fluorescent compound as the host compound described above. Employing the phosphorescent compound emitting a phosphorescent light with a maximum phosphorescence wavelength longer than a maximum fluorescence wavelength of the fluorescent compound as the host compound, that is, an EL element can be obtained in which phosphorescence from the phosphorescent compound or through a triplet state is emitted, and electroluminescence light having wavelengths longer than a maximum fluorescence wavelength of the fluorescent compound is emitted. The maximum phosphorescence wavelength of the phosphorescent compound used is not specifically limited, but the wavelength of emitted light can be theoretically varied selecting a center metal, a ligand, or a substituent of the ligand contained in the phosphorescent compound used.

For example, employing a fluorescent compound having a maximum fluorescent wavelength in the range of from 350 to 440 nm as a host compound, and an iridium complex having a phosphorescent light in a green wavelength region, an EL element can be obtained which emits electroluminescence light in the green wavelength region.

As another embodiment of the invention, there is, as described above, an organic electroluminescence element comprising, in addition to a first fluorescent compound A as a host compound and a phosphorescent compound, a second fluorescent compound B having a maximum fluorescence wavelength longer than the maximum emission wavelength of light emitted by the phosphorescent compound. In this case, electroluminescence of the organic EL element is emitted from the second fluorescent compound B to which energy is transferred from the first fluorescent compound A and the phosphorescent compound.

Color of light emitted from the fluorescent compound in the invention is measured by a spectral light meter CS-1000, manufactured by Minolta Co., Ltd., and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The molecular weight of the host compounds represented by formulae (1) through (6) is in the range of preferably from 600 to 5000. The compounds having the molecular weight of such a range have a high Tg (glass transition point), and improve a thermal stability, and provide the EL element with long lifetime. The molecular weight of the host compounds is more preferably in the range of from 800 to 2000. The Tg is preferably not less than 100° C. Further, the compounds having the molecular weight of the above mentioned range can provide a light emission layer capable of being easily formed by an vacuum deposition method, and therefore, an organic EL element can be easily manufactured. Furthermore, thermal stability of the fluorescent compound in the organic EL element is higher.

An organic EL element, comprising layers such as a hole injecting layer, a hole transporting layer, an electron injecting layer and an electron transporting layer other than the light emission layer, will be explained below.

The hole injecting layer or the hole transporting layer has a function of transporting holes injected from the anode to the light emission layer. Many positive holes can be injected at a lower electric field by the presence of the hole injecting layer or the hole transporting layer between the anode and the light emission layer. Moreover, an element having the hole injecting layer or the hole transporting layer increases a light emission efficiency and has an excellent light emission ability, since the electrons injected into the light emission layer from the cathode, the electron injecting layer or the electron transporting layer are accumulated at the interface between the light emission layer and the hole injecting layer or the hole transporting layer, an electron barrier existing at the interface. The material for the hole injecting layer and the hole transporting layer (hereinafter referred to also as a hole injecting material and a hole transporting material, respectively) can be optionally selected from known materials without any limitation as far as they have a function capable of transporting the holes injected from the anode to the light emission layer. Such materials include those employed for hole transporting materials in conventional photoconductive elements or known materials used in the hole injecting layer or hole transporting layer of conventional EL elements.

The hole injecting material or the hole transporting material described above may be either an organic substance or an inorganic substance as long as it has a hole injecting ability, a hole transporting ability or an ability to form a barrier to electron. Examples of the hole injecting material or the hole transporting material include a triazole derivative, an oxadiazole derivative, an imidazole derivative, a polyarylalkane derivative, a pyrazoline derivative and a pyrazolone derivative, a phenylenediamine derivative, an arylamine derivative, an amino substituted chalcone derivative, an oxazole derivative, a styryl anthracene derivative, a fluorenone derivative, a hydrazone derivative, a stilbene derivative, a silazane derivative, an aniline copolymer, and an electroconductive oligomer, particularly a thiophene oligomer. As the hole injecting material or the hole transporting material, those described above can be used, but a porphyrin compound, an aromatic tertiary amine compound, or a styrylamine compound is preferably used, and an aromatic tertiary amine compound is more preferably used.

Typical examples of the aromatic tertiary amine compound and styrylamine compound include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)-phenylmethane, bis (4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quardriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, N-phenylcarbazole, compounds described in U.S. Pat. No. 5,061,569 which have two condensed aromatic rings in the molecule thereof such as 4,4'-bis[N-(1-naphthyl)-N-phenylamino]biphenyl (NPD), and compounds described in Japanese Patent O.P.I. Publication No. 4-308688 such as 4,4',4"-tris[N-(3-methylphenyl)-N-phenylamino]-triphenylamine (MTDATA) in which three triphenylamine units are bonded in a starburst form.

A polymer in which the material mentioned above is introduced in the polymer chain or a polymer having the material as the polymer main chain can be also used.

As the hole injecting material or the hole transporting material, inorganic compounds such as p-Si and p-SiC are usable. The hole injecting layer or the hole transporting layer can be formed layering the hole injecting material or the hole transporting material described above according to a known method such as a vacuum deposition method, a spin coat method, a casting method, an ink jet method, and an LB method. The thickness of the hole injecting layer or the hole transporting layer is not specifically limited, but is ordinarily from 5 nm to 5 $\mu$m. The hole injecting layer or the hole transporting layer may be composed of a single layer comprising one or two or more of the materials mentioned above, or of plural layers the composition of which may be the same or different.

An electron transporting layer which is provided according to necessity is a layer having a function of transporting electrons injected to the cathode to the light emission layer. The material for the electron transporting layer may be optionally selected from known compounds.

Examples of the material used in the electron transporting layer (hereinafter referred to also as electron transporting material) include a nitro-substituted fluorene derivative, a diphenylquinone derivative, a thiopyran dioxide derivative, a tetracarboxylic acid anhydride such as naphthalene tetracarboxylic acid anhydride or perylene tetracarboxylic acid anhydride, a carbodiimide, a fluolenylidenemethane derivative, an anthraquinodimethane an anthrone derivative, and an oxadiazole derivative. Moreover, a thiadiazole derivative which is formed by substituting the oxygen atom in the oxadiazole ring of the foregoing oxadiazole derivative with a sulfur atom, and a quinoxaline derivative having a quinoxaline ring known as an electron withdrawing group are usable as the electron transporting material.

A polymer in which the material mentioned above is introduced in the polymer chain or a polymer having the material as the polymer main chain can be also used.

A metal complex of an 8-quinolinol derivative such as tris(8-quinolinolato)aluminum (Alq$_3$), tris(5,7-dichloro-8-quinolinolato)aluminum, tris(5,7-dibromo-8-quinolinolato) aluminum, tris(2-methyl-8-quinolinolato)aluminum, tris(5-methyl-8-quinolinolato)aluminum, or bis(8-quinolinolato) zinc (Znq$_2$), and a metal complex formed by replacing the center metal of the foregoing complexes with another metal atom such as In, Mg, Cu, Ca, Sn, Ga or Pb, can be used as the electron transporting material. Furthermore, a metal free or metal-containing phthalocyanine, and a derivative thereof, in which the molecular terminal is replaced by a substituent such as an alkyl group or a sulfonic acid group, are also preferably used as the electron transporting material. The distyrylpyrazine derivative exemplified as a material for an light emission layer may preferably be employed as the electron transporting material. An inorganic semiconductor such as n-Si and n-SiC may also be used as the electron transporting material in a similar way as in the hole injecting layer or in the hole transporting layer.

The electron transporting layer can be formed by layering the compounds described above by a known method such as a vacuum deposition method, a spin coat method, a casting method and an LB method. The thickness of the electron transporting layer is not specifically limited, but is ordinarily from 5 nm to 5 $\mu$m. The electron transporting layer may be composed of a single layer comprising one or two or more of the materials mentioned above, or of plural layers comprising the same composition or different composition.

In the invention, the light emission layer contains a fluorescent compound, but a hole or electron transporting layer adjacent to the light emission layer may contain one or more kinds of fluorescent compounds having a maximum fluorescence wavelength in the same wavelength regions as the fluorescent compound as a host compound of the phosphorescent compound described above, whereby an emission efficiency of the EL element can be further increased. The fluorescent compound, which may be contained in the hole or electron transporting layer, is a fluorescent compound having a maximum fluorescence wavelength in the region of preferably from 350 to 440 nm, and more preferably 390 to 410 nm, as the fluorescent compound contained in the light emission layer.

A substrate preferably employed in the organic electroluminescence element of the invention is not restricted to specific kinds of materials such as glass and plastic, as far as it is transparent. Examples of the substrate preferably employed used in the organic electroluminescence element of the invention include glass, quartz and light transmissible plastic film.

Examples of the light transmissible plastic film include films such as polyethylene terephthalate (PET), polyethylene naphthalate (PEN), polyethersulfone (PES), polyetherimide, polyetheretherketone, polyphenylene sulfide, polyarylate, polycarbonate (PC), cellulose triacetate (TAC), cellulose acetate propionate (CAP) and so on Preferable examples in the preparation of the organic EL element will be described below.

For one example, the preparation of the EL element having the foregoing constitution, Anode/Hole injecting layer/Hole transporting layer/Light emission layer/Electron transporting layer/Electron injecting layer/Cathode, will be described.

A thin layer of a desired material for electrode such as a material for an anode is formed on a suitable substrate by a deposition or sputtering method, so that the thickness of the layer is not more than 1 µm, and preferably within the range of from 10 to 200 nm to prepare the anode. Then the hole injecting layer, the hole transporting layer, the light emission layer, the electron transporting layer and the electron injecting layer, which constitute the element, are formed on the resulting anode in that order.

A buffering layer (an electrode interface layer) may be provided between the anode and the light emission layer or the hole injecting layer, or between the cathode and the light emission layer or the electron injecting layer.

The buffering layer is a layer provided between the electrode and an organic layer in order to reduce the driving voltage or to improve of light emission efficiency. As the buffering layer there are an anode buffering layer and a cathode buffering layer, which are described in detail in "Electrode Material" page 123, Div. 2 Chapter 2 of "Organic EL element and its frontier of industrialization" (published by NTS Corporation, Nov. 30, 1998).

The anode buffering layer is described in detail in Japanese Patent O.P.I. Publication Nos. 9-45479, 9-260062, and 8-288069 etc., and its examples include a phthalocyanine buffering layer represented by a copper phthalocyanine layer, an oxide buffering layer represented by a vanadium oxide layer, an amorphous carbon buffering layer, a polymer buffering layer employing an electroconductive polymer such as polyaniline (emeraldine), and polythiophene, etc.

The cathode buffering layer is described in detail in Japanese Patent O.P.I. Publication Nos. 6-325871, 9-17574, and 9-74586, etc., and its examples include a metal buffering layer represented by a strontium or aluminum layer, an alkali metal compound buffering layer represented by a lithium fluoride layer, an alkali earth metal compound buffering layer represented by a magnesium fluoride layer, and an oxide buffering layer represented by an aluminum oxide or lithium oxide layer.

The buffering layer is preferably very thin and has a thickness of preferably from 0.1 to 100 nm depending on kinds of the material used.

A layer having another function may be provided if necessary in addition to the fundamental component layers as described above, for example a hole blocking layer may be added as described in Japanese Patent O.P.I. Publication Nos. 11-204258, and 11-204359, and on page 237 of "Organic EL element and its frontier of industrialization" (published by NTS Corporation, Nov. 30, 1998).

At least one of the cathode buffering layer and anode buffering layer may contain the compound in the invention, and function as a light emission layer.

Next, electrodes of the organic EL element will be explained. The electrodes consist of a cathode and an anode.

As the electrode material for the anode of the organic EL element, a metal, an alloy, or an electroconductive compound each having a high working function (not less than 4 eV), and mixture thereof are preferably used. Concrete examples of such an electrode material include a metal such as Au, and a transparent electroconductive material such as CuI, indium tin oxide (ITO), $SnO_2$, or ZnO.

As the anode, a thin layer of the electrode material described above is formed according to a depositing or sputtering method, in which the layer may be formed into a desired pattern according to photolithography, or in which when required precision of the pattern is not so high (not less than 100 µm), the layer may be formed into a desired pattern through a mask having the pattern. When light is emitted through the anode, the transmittance of the anode is preferably 10% or more, and the sheet resistivity of the anode is preferably not more than several hundred Ω/□. The thickness of the layer is ordinarily within the range of from 10 nm to 1 µm, and preferably from 10 to 200 nm, although it may vary due to kinds of materials used.

On the other hand, as the electrode material for the cathode, a metal (also referred to as an electron injecting metal), an alloy, and an electroconductive compound each having a low working function (not more than 4 eV), and a mixture thereof is used. Concrete examples of such an electrode material include sodium, sodium-potassium alloy, magnesium, lithium, a magnesium/copper mixture, a magnesium/silver mixture, a magnesium/aluminum mixture, magnesium/indium mixture, an aluminum/aluminum oxide ($Al_2O_3$) mixture, indium, a lithium/aluminum mixture, and a rare-earth metal. Among them., a mixture of an electron injecting metal and a metal with a working function higher than that of the electron injecting metal, such as a magnesium/silver mixture, a magnesium/aluminum mixture, a magnesium/indium mixture, an aluminum/aluminum oxide ($Al_2O_3$) mixture or a lithium/aluminum mixture, is suitable from the view point of the electron injecting ability and resistance to oxidation. The cathode can be prepared forming a thin layer of such an electrode material according to a method such as a deposition or sputtering method. The sheet resistivity as the cathode is preferably not more than several hundred Ω/□, and the thickness of the cathode is ordinarily from 10 nm to 1 µm, and preferably from 50 to 200 nm. It is preferable in increasing the light emission efficiency that either the anode or the cathode of the organic EL element is transparent or semi-transparent. A preparation method of the organic EL element will be explained below.

For formation of a thin layer, a vacuum deposition method is preferably used even though a spin coating method, a casting method and a deposition method can be used. The vacuum deposition method is preferable since a uniform layer can be formed and a pinhole is formed with difficulty. Although conditions of the vacuum deposition are different due to kinds of materials used or due to an intended crystalline or association structure of the molecular deposition layer, the vacuum deposition is preferably carried out at a boat temperature of from 50° C. to 450° C., at a vacuum degree of from $10^{-6}$ to $10^{-3}$ Pa, at a deposition speed of from 0.01 to 50 nm/second, and at a substrate temperature of from −50 to 300° C., to form a layer thickness of from 5 nm to 5 μm.

As described above, on a suitable substrate, a thin layer of a desired electrode material such as an anode material is formed by a deposition or sputtering method so that the thickness of the layer is not more than 1 μm, preferably within the range of from 10 to 200 nm to prepare an anode. Then a hole injecting layer, a hole transporting layer, a light emission layer and an electron transporting layer and an electron injecting layer are formed on the anode in that order as described above. After formation of these layers, a thin layer comprising a material for cathode is formed thereon by, for example, a deposition method or sputtering method so that the thickness is not more than 1 μm, and preferably from 50 to 200 nm, to provide the cathode. Thus a desired organic EL element is obtained. It is preferred that the layers from the hole injecting layer to the cathode are continuously formed under one time of vacuuming to prepare the organic EL element. Further, the organic EL element can be prepared in the reverse order, in which the cathode, the electron injecting layer, the light emission layer, hole injecting layer, and the anode are formed in that order. Light emission can be observed when a direct current with a voltage of from about 5 to 40 V is applied to the thus prepared organic EL element so that the polarity of the anode is positive and that of the cathode is negative. When the voltage is applied in the reverse polarity, no current is generated and light is not emitted at all. When an alternating voltage is applied, light is emitted only when the polarity of the anode is positive and that of the cathode is negative. The shape of the wave of the alternating current may be optionally selected.

EXAMPLES

The present invention will be explained in the following examples, but is not limited thereto.

EXAMPLES

An organic electroluminescence element samples No. 1 through 28 were prepared according to the following procedures.

Example 1

[Preparation of organic EL element sample] A pattern was formed on a substrate (manufactured by NH Technoglass Co., Ltd.) composed of a glass plate (100 mm×100 mm×1.1 mm) and a 150 nm ITO (indium tin oxide) layer as an anode. Then the resulting transparent substrate having the ITO transparent electrode was subjected to ultrasonic washing in i-propyl alcohol and dried by a dry nitrogen gas and subjected to UV-ozone cleaning for 5 minutes.

The thus obtained transparent substrate was fixed on a substrate holder of a vacuum deposition apparatus available on the market. Further, 200 mg of α-NPD were put in a first resistive heating molybdenum boat, 200 mg of CBP were put in a second resistive heating molybdenum boat, 200 mg of bathocuproine (BCP) were put in a third resistive heating molybdenum boat, 100 mg of Ir-1 (phosphorescent compound) were put in a fourth resistive heating molybdenum boat, and 200 mg of a compound $Alq_3$ were put in a fifth resistive heating molybdenum boat. The resulting boats were set in the vacuum deposition apparatus, and pressure in the vacuum tank was reduced to $4\times10^{-4}$ Pa. Then, the boat carrying α-NPD being heated to 220° C. by supplying an electric current to the boat, α-NPD was deposited onto the transparent substrate at a depositing speed of 0.1 nm/sec to form a hole transporting layer with a thickness of 45 nm.

After that, the boat carrying CBP and the boat carrying Ir-1 being heated to 220° C. by supplying an electric current to both boats, CBP at a depositing speed of 0.1 nm/sec and Ir-1 at a depositing speed of 0.01 nm/sec were co-deposited onto the resulting hole transporting layer to form a light emission layer with a thickness of 20 nm. The temperature of the substrate at the time of the deposition was room temperature. Subsequently, the boat carrying BCP being heated to 250° C. by supplying an electric current to the boat, BCP was deposited onto the resulting light emission layer at a depositing speed of 0.1 nm/sec to form a first electron transporting layer with a thickness of 10 nm which could function as a hole blocking layer. Further, the boat carrying $Alq_3$ being heated to 250° C. by supplying an electric current to the boat, $Alq_3$ was deposited onto the resulting electron transporting layer at a depositing speed of 0.1 nm/sec to form a second electron transporting layer with a thickness of 40 nm. The temperature of the substrate at the time of the deposition was room temperature.

Next, the vacuum tank was opened, and a stainless steel mask having a rectangular hole was placed on the second electron transporting layer. Further, 3 g of magnesium were put in a resistive heating molybdenum boat and 0.5 g of silver were put in a tungsten basket for deposition. The resulting boat and basket were set in the vacuum tank. Pressure in the vacuum tank was reduced to $2\times10^{-4}$ Pa. Then, the boat carrying magnesium was heated by supplying an electric current so as to deposit magnesium at a deposition speed of from 1.5 to 2.0 nm/sec, and at this time, the basket carrying silver was simultaneously heated so as to deposit silver at a deposition speed of 0.1 nm/sec to form a counter electrode composed of a mixture of magnesium and silver. Thus, a comparative organic EL element sample No. 1 was prepared.

Orgnic EL element sample Nos. 2 through 28 were prepared in the same manner as comparative organic EL element sample No. 1, except that CBP used in the light emission layer was replaced with those as shown in Table 1.

The chemical structures of the compounds used in the above are shown below.

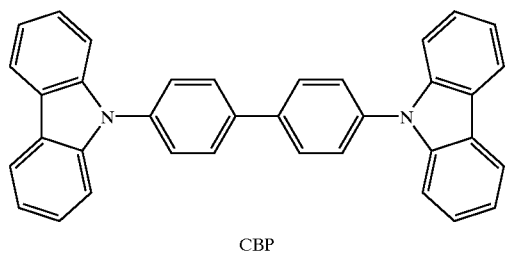

CBP

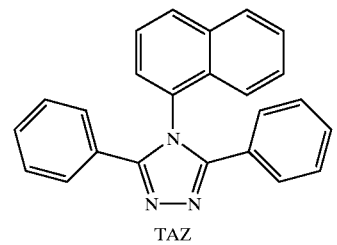

TAZ

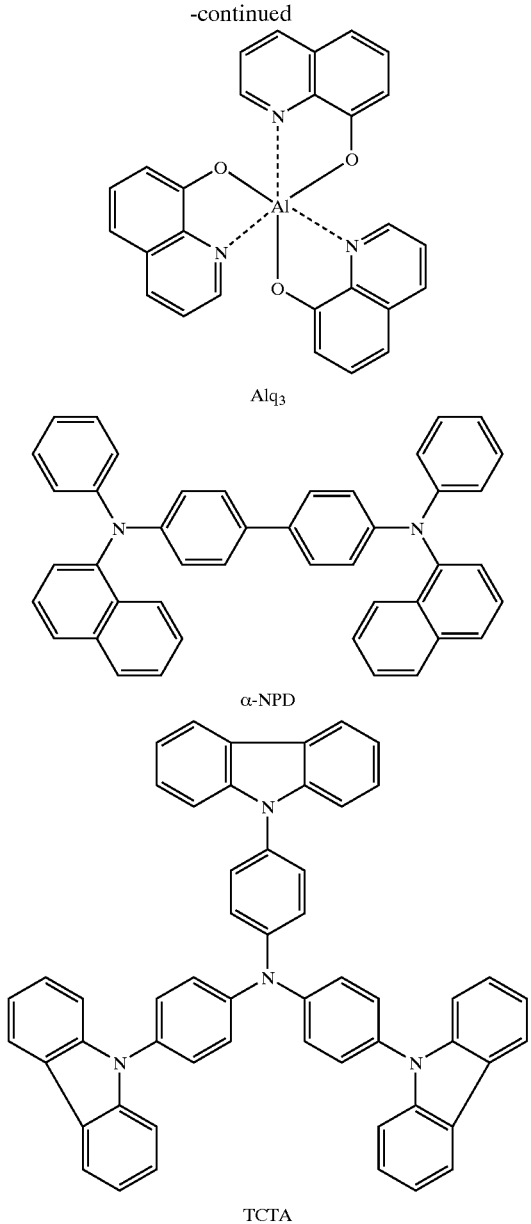

Alq₃

α-NPD

TCTA

<Evaluation of Emission Luminance and emission Lifetime of ORGANIC EL ELEMENT SAMPLE Nos. 1 Through 28>

When an initial driving voltage of 3V was applied to comparative organic EL element sample No. 1, an electric current began flowing and a green light was emitted from the phosphorescent compound as the dopant compound in the light emission layer. When a direct current voltage of 9V was applied to comparative organic EL element sample No. 1 at 23° C. in an atmosphere of a dry nitrogen gas, emission luminance of emitted light was measured and time when initial luminance reduced by half was measured as the emission lifetime. The emission luminance and emission lifetime in each of the organic EL element sample Nos. 2 through 28 were measured in the same way as above. Emission luminance of emitted light in each of the organic EL element sample Nos. 2 through 28 was measured in the same way as above, and expressed by a relative value when the emission luminance of the comparative organic EL element sample No. 1 was set at 100. Similarly, emission lifetime in each of the organic EL element sample Nos. 2 through 2B was measured in the same way as above, and expressed by a relative value when the emission lifetime of the comparative organic EL element sample No. 1 was set at 100. The emission luminance (cd/m²) was measured according to CS-1000 produced Minolta Co., Ltd. The results are shown in Table 1.

TABLE 1

| Sample No. | Host compound used | Molecular weight | Emission luminance | Emission lifetime | Remarks |
|---|---|---|---|---|---|
| 1 | CBP | | 100 | 100 | Comp. |
| 2 | TAZ | | 104 | 80 | Comp. |
| 3 | TCTA | | 112 | 121 | Comp. |
| 4 | 1-1 | 735 | 121 | 131 | Inv. |
| 5 | 1-4 | 927 | 124 | 256 | Inv. |
| 6 | 1-7 | 401 | 131 | 106 | Inv. |
| 7 | 2-3 | 851 | 137 | 483 | Inv. |
| 8 | 2-5 | 817 | 136 | 467 | Inv. |
| 9 | 3-1 | 663 | 134 | 337 | Inv. |
| 10 | 4-1 | 654 | 152 | 327 | Inv. |
| 11 | 4-3 | 1051 | 163 | 493 | Inv. |
| 12 | 4-4 | 614 | 154 | 336 | Inv. |
| 13 | 4-5 | 1011 | 157 | 521 | Inv. |
| 14 | 4-7 | 826 | 162 | 511 | Inv. |
| 15 | 4-8 | 727 | 160 | 397 | Inv. |
| 16 | 5-1 | 843 | 144 | 468 | Inv. |
| 17 | 5-2 | 1041 | 144 | 511 | Inv. |
| 18 | 5-4 | 1191 | 160 | 657 | Inv. |
| 19 | 5-5 | 1095 | 162 | 734 | Inv. |
| 20 | 5-7 | 1203 | 152 | 682 | Inv. |
| 21 | 5-8 | 1275 | 149 | 689 | Inv. |
| 22 | 6-1 | 493 | 132 | 321 | Inv. |
| 23 | 6-3 | 491 | 130 | 337 | Inv. |
| 24 | 6-4 | 570 | 139 | 316 | Inv. |
| 25 | 6-5 | 638 | 142 | 426 | Inv. |
| 26 | 6-8 | 615 | 156 | 433 | Inv. |
| 27 | 6-12 | 740 | 143 | 456 | Inv. |
| 28 | 6-13 | 1573 | 145 | 586 | Inv. |

Comp.: Comparative, Inv.: Inventive

As is apparent from Table 1 above, inventive organic electroluminescence element samples comprising a light emission layer containing the host compound in the invention emit light with high emission luminance and long emission lifetime. The inventive samples have proved to be extremely useful for an organic EL element.

Organic EL elements, which were prepared in the same manner as in organic EL element samples No. 1 through 28, except that Ir-12 was used instead of Ir-1, and organic EL elements, which were prepared in the same manner as in organic EL element samples No. 1 through 28, except that Ir-9 was used instead of Ir-1, also exhibited the same results as above. Blue light was emitted from organic EL elements employing Ir-12, and red light was emitted from organic EL elements employing Ir-9.

Example 2

The red light-emitting organic EL element, green light-emitting organic EL element, and blue light-emitting organic EL element prepared in Example 1 were arranged on the same substrate, and a full color display as shown in FIG. 1 was prepared employing the elements, which could be used according to an active matrix system.

FIG. 1 shows a schematic drawing of a displaying section A of the full color display prepared above.

The displaying section A has a wiring portion including a plurality of scanning signal lines 5 and a plurality of data signal lines 6, and a plurality of pixels 3 (a red-light emitting pixel, a green-light emitting pixel and a blue-light emitting pixel, etc.) on the same substrate. The scanning signal lines 5 and the data signal lines 6 are composed of an electro-conductive material. The lines 5 and the lines 6 are crossed with each other at a right angle, and connected with the pixels 3 at the crossing position (not illustrated in detail). Each of the plural pixels 3, which comprise the organic EL element emitting light with the respective color, a switching transistor as an active element, and a driving transistor, is driven according to an active matrix system. The plural pixels 3, when scanning signal is applied from the scanning lines 5, receives the image data signal from the data lines 6, and emits light corresponding to the image data received. Thus, full color can be displayed employing a red light emission pixel, a green light emission pixel, and a blue light emission pixel, each suitably arranged on the same substrate.

A full color clear moving image with high luminance was obtained by driving the full color display prepared above.

[Effect Of The Invention]

The present invention provides an organic electroluminescence element emitting light with high emission luminance and long emission lifetime, and a display employing the organic electroluminescence element.

What is claimed is:

1. An organic electroluminescence element comprising a light emission layer containing a host compound and a phosphorescent compound, wherein the phosphorescent compound is a metal complex containing a metal belonging to a group VIII of the periodic table as a center metal, and the host compound is a compound represented by the following formula (2):

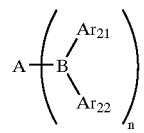

formula (2)

wherein B represents a boron atom; $Ar_{21}$, and $Ar_{22}$ independently represent an aromatic group; A represents a trivalent to pentadecavalent group; and n is an integer of from 3 to 15.

2. The organic electroluminescence element of claim 1, wherein the trivalent to pentadecavalent group represented by A is a residue of a monocyclic compound, a residue of a condensed ring compound, or a residue of a compound having two or more rings in the molecule, separately.

3. An organic electroluminescence element comprising a light emission layer containing a host compound and a phosphorescent compound, wherein the phosphorescent compound is a metal complex containing a metal belonging to a group VIII of the periodic table as a center metal, and the host compound is a compound represented by the following formula (3):

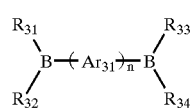

formula (3)

wherein B represents a boron atom; $Ar_{31}$ represents a monocyclic aromatic group; $R_{31}$, $R_{32}$, $R_{33}$ and $R_{34}$ independently represent a monovalent substituent; and n represents an integer of from 1 to 5.

4. The organic electroluminescence element of claim 3, wherein the monovalent substituent represented by $R_{31}$, $R_{32}$, $R_{33}$ and $R_{34}$ is an alkyl group, a cycloalkyl group, an aryl group, an alkoxy group, an aryloxy group, an alkylthio group, an arylthio group, a halogen atom, a cyano group, a nitro group, or a heterocyclic group.

5. The organic electroluminescence element of claim 3, wherein the host compound is a compound represented by the following formula (4):

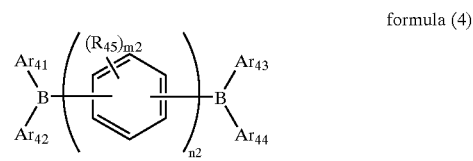

formula (4)

wherein B represents a boron atom; $Ar_{41}$, $Ar_{42}$, $Ar_{43}$ and $Ar_{44}$ independently represent an aromatic group; $R_{45}$ represents a hydrogen atom or a monovalent substituent; n2 is an integer of 1 to 5; and m2 is an integer of 1 to 4, provided that plural $R_{45}$s may be the same or different.

6. An organic electroluminescence element comprising a light emission layer containing a host compound and a phosphorescent compound, wherein the phosphorescent compound is a metal complex containing a metal belonging to a group VIII of the periodic table as a center metal, and the host compound is a compound represented by the following formula (5):

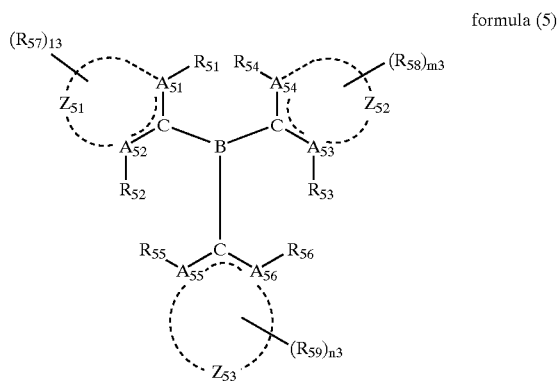

formula (5)

wherein B represents a boron atom; C represents a carbon atom; $A_{51}$, $A_{52}$, $A_{53}$, $A_{54}$, $A_{55}$, and $A_{56}$ independently represent a carbon atom, a nitrogen atom or a sulfur atom; $Z_{51}$ represents an atomic group necessary to form an aromatic ring together with C, $A_{51}$ and $A_{52}$; $Z_{52}$ represents an atomic group necessary to form an aromatic ring together with C, $A_{53}$ and $A_{54}$; $Z_{53}$ represents an atomic group necessary to form an aromatic ring together with C, $A_{55}$ and $A_{56}$; $R_{51}$, $R_{52}$, $R_{53}$, $R_{54}$, $R_{55}$, and $R_{56}$ independently represent a hydrogen atom or a monovalent substituent, provided that at least four of $R_{51}$, $R_{52}$, $R_{53}$, $R_{54}$, $R_{55}$, and $R_{56}$ represent the monovalent substituent; $R_{57}$, $R_{58}$ and $R_{59}$ independently represent a hydrogen atom or a monovalent substituent; and l3, n3 and m3 independently represent an integer of from 1 to 7, provided that plural $R_{57}$s, $R_{58}$s and $R_{59}$s may be the same or different, respectively.

7. The organic electroluminescence element of claim 6, wherein all of $R_{51}$, $R_{52}$, $R_{53}$, $R_{54}$, $R_{55}$, and $R_{56}$ in formula (5) are the monovalent substituents.

8. The organic electroluminescence element of claim 6, wherein the monovalent substituent represented by $R_{51}$, $R_{52}$, $R_{53}$, $R_{54}$, $R_{55}$, $R_{56}$, $R_{57}$, $R_{58}$ and $R_{59}$ in formula (5) is an alkyl group, a cycloalkyl group, an aryl group, an alkoxy group, an aryloxy group, an alkylthio group, an arylthio group, a halogen atom, a cyano group, a nitro group, or a heterocyclic group.

9. The organic electroluminescence element of claim 8, wherein the monovalent substituent is an alkyl group, a cycloalkyl group, an alkoxy group, an aryloxy group, or a halogen atom.

10. The organic electroluminescence element of claim 6, wherein the host compound has a molecular weight of from 410 to 2000.

11. The organic electroluminescence element of claim 6, wherein the host compound has a molecular weight of from 600 to 2000.

12. An organic electroluminescence element comprising a light emission layer containing a host compound and a phosphorescent compound, wherein the phosphorescent compound is a metal complex containing a metal belonging to a group VIII of the periodic table as a center metal, and the host compound is a compound represented by the following formula (6):

formula (6)

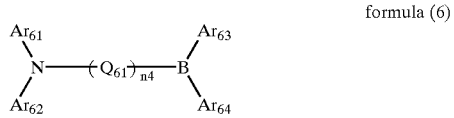

wherein N represents a nitrogen atom; B represents a boron atom; $Ar_{61}$, $Ar_{62}$, $Ar_{63}$ and $Ar_{64}$ independently represent a substituted or unsubstituted aromatic group; $Q_{61}$ represents a monocyclic aromatic group; and n4 is an integer of from 1 to 5.

13. The organic electroluminescence element of claim 1, wherein the host compound has a molecular weight of from 410 to 2000.

14. The organic electroluminescence element of claim 13, wherein the host compound has a molecular weight of from 600 to 2000.

15. The organic electroluminescence element of claim 14, wherein the host compound has a molecular weight of from 800 to 2000.

16. The organic electroluminescence element of claim 1, wherein the phosphorescent compound is an osmium complex, an iridium complex or a platinum complex.

17. The organic electroluminescence element of claim 16, wherein the phosphorescent compound is an iridium complex.

18. A display comprising the organic electroluminescence element of claim 1, 3, 6 or 12.

19. The organic electroluminescence element of claim 3, wherein the host compound has a molecular weight of from 410 to 2000.

20. The organic electroluminescence element of claim 19, wherein the host compound has a molecular weight of from 600 to 2000.

21. The organic electroluminescence element of claim 20, wherein the host compound has a molecular weight of from 800 to 2000.

22. The organic electroluminescence element of claim 3, wherein the phosphorescent compound is an osmium complex, an iridium complex or a platinum complex.

23. The organic electroluminescence element of claim 22, wherein the phosphorescent compound is an iridium complex.

24. The organic electroluminescence element of claim 6, wherein the host compound has a molecular weight of from 410 to 2000.

25. The organic electroluminescence element of claim 24, wherein the host compound has a molecular weight of from 600 to 2000.

26. The organic electroluminescence element of claim 25, wherein the host compound has a molecular weight of from 800 to 2000.

27. The organic electroluminescence element of claim 6, wherein the phosphorescent compound is an osmium complex, an iridium complex or a platinum complex.

28. The organic electroluminescence element of claim 27, wherein the phosphorescent compound is an iridium complex.

29. The organic electroluminescence element of claim 12, wherein the host compound has a molecular weight of from 410 to 2000.

30. The organic electroluminescence element of claim 29, wherein the host compound has a molecular weight of from 600 to 2000.

31. The organic electroluminescence element of claim 30, wherein the host compound has a molecular weight of from 800 to 2000.

32. The organic electroluminescence element of claim 12, wherein the phosphorescent compound is an osmium complex, an iridium complex, or a platinum complex.

33. The organic electroluminescence element of claim 32, wherein the phosphorescent compound is an iridium complex.

* * * * *